United States Patent
Lee

(10) Patent No.: US 9,356,037 B2
(45) Date of Patent: May 31, 2016

(54) MEMORY ARCHITECTURE OF 3D ARRAY WITH INTERLEAVED CONTROL STRUCTURES

(71) Applicant: Macronix International Co., Ltd., Hsinchu (TW)

(72) Inventor: GuanRu Lee, Kaohsiung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 23 days.

(21) Appl. No.: 14/324,892

(22) Filed: Jul. 7, 2014

(65) Prior Publication Data

US 2016/0005746 A1 Jan. 7, 2016

(51) Int. Cl.
*G11C 11/34* (2006.01)
*H01L 27/115* (2006.01)
*G11C 16/06* (2006.01)

(52) U.S. Cl.
CPC .......... *H01L 27/11573* (2013.01); *G11C 16/06* (2013.01); *H01L 27/11565* (2013.01); *H01L 27/11578* (2013.01)

(58) Field of Classification Search
CPC ............. H01L 27/11582; H01L 27/11556; H01L 27/11524; H01L 27/11551; H01L 27/11519; H01L 27/2481; H01L 23/528; H01L 27/0207; H01L 27/11573; G11C 2029/1202; G11C 16/06
USPC ............. 365/185.05, 185.11, 185.18, 63, 51
See application file for complete search history.

(56) References Cited

U.S. PATENT DOCUMENTS

| | | |
|---|---|---|
| 6,906,940 B1 | 6/2005 | Lue |
| 7,315,474 B2 | 1/2008 | Lue |
| 7,420,242 B2 | 9/2008 | Lung |
| 7,696,559 B2 | 4/2010 | Arai et al. |
| 7,851,849 B2 | 12/2010 | Kiyotoshi |
| 8,363,476 B2 | 1/2013 | Lue et al. |
| 8,467,219 B2 | 6/2013 | Lue |
| 8,503,213 B2 | 8/2013 | Chen et al. |
| 8,759,899 B1 | 6/2014 | Lue et al. |
| 2005/0280061 A1 | 12/2005 | Lee |
| 2007/0045708 A1 | 3/2007 | Lung |

(Continued)

FOREIGN PATENT DOCUMENTS

EP 2048709 A2 4/2009

OTHER PUBLICATIONS

Chen et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012, pp. 91-92.

(Continued)

*Primary Examiner* — Fernando Hidalgo
(74) *Attorney, Agent, or Firm* — Haynes Beffel & Wolfeld LLP

(57) ABSTRACT

A 3D memory device includes a first plurality and a second plurality of stacks of semiconductor material strips on a substrate. The second plurality of stacks of gate material strips on the substrate is interleaved with, and coplanar with, the first plurality of stacks. The second plurality of stacks is configured as gates for the first plurality of stacks. A first plurality of word lines is arranged orthogonally over, and having surfaces conformal with, the first plurality of stacks, such that a 3D array of memory elements is established at cross-points between surfaces of the first plurality of stacks and the plurality of word lines.

15 Claims, 25 Drawing Sheets

(56) References Cited

U.S. PATENT DOCUMENTS

| | | | |
|---|---|---|---|
| 2007/0252201 | A1 | 11/2007 | Kito et al. |
| 2008/0073635 | A1 | 3/2008 | Kiyotoshi et al. |
| 2008/0175032 | A1* | 7/2008 | Tanaka .................. G11C 5/025 365/51 |
| 2008/0180994 | A1 | 7/2008 | Katsumata et al. |
| 2009/0097321 | A1 | 4/2009 | Kim et al. |
| 2009/0184360 | A1 | 7/2009 | Jin et al. |
| 2010/0226195 | A1* | 9/2010 | Lue ..................... H01L 27/0688 365/230.06 |
| 2010/0270593 | A1 | 10/2010 | Lung et al. |
| 2012/0068241 | A1 | 3/2012 | Sakuma et al. |
| 2012/0119283 | A1 | 5/2012 | Lee et al. |
| 2012/0182806 | A1 | 7/2012 | Chen et al. |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Hung et al., "A highly scalable vertical gate (VG) 3D NAND Flash with robust program disturb immunity using a novel PN diode decoding structure," 2011 Symp. on VLSI Technology (VLSIT), Jun. 14-16, 2011, pp. 68-69.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Three-Dimensional NAND Flash Architecture Design Based on Single-Crystalline STacked ARray," IEEE Transactions on Electron Devices, vol. 59, No. 1, pp. 35-45, Jan. 2012.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lue et al., "A Highly Scalable 8-Layer 3D Vertical-Gate (VG) TFT NAND Flash Using Junction-Free Buried Channel BE-SONOS Device", 2010 Symposium on VLSI Technology Digest of Technical Papers, pp. 131-132, Jun. 15-17, 2010.

Nowak et al., "Intrinsic fluctuations in Vertical NAND flash memories," 2012 Symposium on VLSI Technology, Digest of Technical Papers, pp. 21-22, Jun. 12-14, 2012.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Wang, Michael, "Technology Trends on 3D-NAND Flash Storage", Impact 2011, Taipei, dated Oct. 20, 2011, found at www.impact.org.tw/2011/Files/NewsFile/201111110190.pdf.

* cited by examiner

MEMORY ARCHITECTURE OF 3D ARRAY WITH INTERLEAVED CONTROL STRUCTURES

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit.

FIG. 1 is a perspective illustration of an implementation of a three-dimensional (3D) integrated circuit device using a vertical gate structure. The device 100 illustrated in FIG. 1 includes a plurality of stacks of conductive strips alternating with insulating strips in the Z-direction on an integrated circuit substrate.

In the example shown in FIG. 1, a multilayer array is formed on an insulating layer, and includes a plurality of structures of a conductive material, such as a plurality of word lines 125-1 WL through 125-N WL, arranged orthogonally over and conformal with the plurality of stacks. Conductive strips in the stacks of conductive strips in multiple planes (e.g. 112, 113, 114, and 115) can include channels for the memory elements, and structures in the plurality of structures (e.g. 125-1 WL through 125-N WL) can be arranged as word lines and string select lines including vertical gates for memory elements. Conductive strips in the same plane are electrically coupled together by a stack of linking elements (e.g. 102B, 103B, 104B and 105B).

A contact structure including a stack of linking elements 112A, 113A, 114A, and 115A terminate conductive strips, such as the conductive strips 112, 113, 114, and 115 in the plurality of stacks. As illustrated, these linking elements 112A, 113A, 114A, and 115A are electrically connected to different bit lines for connection to decoding circuitry to select planes within the array. These linking elements 112A, 113A, 114A, and 115A can be patterned at the same time that the plurality of stacks is defined.

The stack of linking elements (e.g. 102B, 103B, 104B and 105B) are separated by insulating layers (not shown) in the Z-direction, and terminate conductive strips, such as conductive strips 102, 103, 104, and 105. The insulating layers can include the insulating material as described for the insulating strips between the conductive strips in the Z-direction. A plurality of interlayer connectors (e.g. 172, 173, 174, and 175) in the stack of linking elements (e.g. 102B, 103B, 104B, and 105B) extend from a connector surface to respective linking elements. Patterned conductor lines on top of the connector surface can be connected to respective interlayer connectors. As illustrated, interlayer connectors 172, 173, 174, 175 electrically connect linking elements 102B, 103B, 104B, and 105B to different bit lines in patterned conductor lines, such as a metal layer ML3, for connection to decoding circuitry to select planes within the array. The stack of linking elements 102B, 103B, 104B, and 105B can be patterned at the same time that the plurality of stacks is defined.

Any given stack of conductive strips is coupled to either the stack of linking elements 112A, 113A, 114A, and 115A, or the stack of linking elements 102B, 103B, 104B, and 105B, but not both. The stack of conductive strips 112, 113, 114, and 115 is terminated at one end by the stack of linking elements 112A, 113A, 114A, and 115A, passes through SSL gate structure 119, ground select line GSL 126, word lines 125-1 WL through 125-N WL, ground select line GSL 127, and is terminated at the other end by source line 128. The stack of conductive strips 112, 113, 114, and 115 does not reach the stack of linking elements 102B, 103B, 104B, and 105B.

The stack of conductive strips 102, 103, 104, and 105 is terminated at one end by the stack of linking elements 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of conductive strips 102, 103, 104, and 105 does not reach the stack of linking elements 112A, 113A, 114A, and 115A.

A memory layer is disposed in interface regions at cross-points between surfaces of the conductive strips 112-115 and 102-105 in the plurality of stacks of conductive strips, and the plurality of structures of a conductive material, such as a plurality of word lines 125-1 WL through 125-N WL. In particular, the memory layer is formed on side surfaces of the conductive strips in the plurality of stacks. Memory elements are disposed in interface regions at cross-points between side surfaces of the plurality of stacks and the plurality of word lines. Ground select lines GSL 126 and GSL 127 are conformal with the plurality of stacks, similar to the word lines.

Every stack of conductive strips is terminated at one end by linking elements and at the other end by a source line. For example, the stack of conductive strips 112, 113, 114, and 115 is terminated at one end by linking elements 112A, 113A, 114A, and 115A, and terminated on the other end by a source line 128. At the near end of the figure, every other stack of conductive strips is terminated by the linking elements 102B, 103B, 104B, and 105B, and every other stack of conductive strips is terminated by a separate source line. At the far end of the figure, every other stack of conductive strips is terminated by the linking elements 112A, 113A, 114A, and 115A, and every other stack of conductive strips is terminated by a separate source line.

Bit lines and string select gate structures are formed at the metals layers ML1, ML2, and ML3. Bit lines are coupled to a plane decoder (not shown). String select gate structures are coupled to a string select line decoder (not shown).

The ground select lines GSL 126 and 127 can be patterned during the same step that the word lines 125-1 WL through 125-N WL are defined. Ground select devices are formed at cross-points between surfaces of the plurality of stacks and ground select lines GSL 126 and 127. The SSL gate structures 119 and 109 can be patterned during the same step in which the word lines 125-1 WL through 125-N WL are defined. String select devices are formed at cross-points between surfaces of the plurality of stacks and string select (SSL) gate structures 119 and 109. These devices are coupled to decoding circuitry for selecting the strings within particular stacks in the array.

To further increase the quantity of memory cells, additional instances of the memory array shown in FIG. 1 can be repeated along the Y-direction. To connect to the additional instances of the memory array shown in FIG. 1, the bit lines formed at metal layer ML3 are extended along the Y-direction. These extended bit lines formed at metal layer ML3 are connected to the different planes of memory cells in the additional instances of the memory array shown in FIG. 1. In order to perform this connection between the extended bit lines and the different planes of memory cells, additional instances of the linking elements 112A, 113A, 114A, and 115A and additional instances of the linking elements 102B, 103B, 104B, and 105B are repeated along with the additional instances of the memory array. These multiple instances of these linking elements 112A, 113A, 114A, and 115A, and linking elements 102B, 103B, 104B, and 105B consume area in the dense memory array region. As a result, the array efficiency is decreased. It would be desirable to improve the array efficiency of the memory array, by reducing the area consumed by the linking elements in the dense memory array region.

Another point is the complicated nature of routing decoded address signals to a particular memory cell or set of memory cells in the 3D array. SSL gate structures 109 and 119 in FIG. 1 select a particular stack from the plurality of stacks of conductive strips. Linking elements 112A, 113A, 114A, and 115A, and linking elements 102B, 103B, 104B, and 105B select a particular plane from the plurality of stacks of conductive strips. Word lines 125-1 through 125-N select a particular location along the plurality of stacks of conductive strips. It would be desirable to simplify the memory architecture of routing decoded address signals to a particular memory cell or set of memory cells in the 3D array.

SUMMARY OF THE INVENTION

One aspect of the technology is a memory device, comprising a 3D vertical gate NAND array, a plurality of level select gate lines (sometimes called SSL gate lines) in respective levels of the NAND array, and a block select gate line (sometimes called a GSL gate line).

The NAND array including a plurality of levels, each level comprising a plurality of NAND strings having a first switch on one end to connect the string to a common source structure, and second switch on an opposing end to connect the string to a corresponding bit line. The switches can be transistors.

Level select gate lines in the plurality of level select gate lines are connected to the second switches of the plurality of NAND strings in the respective levels of the NAND array. The block select gate is connected to the first switches in the NAND strings in the plurality of levels.

In one embodiment of the technology, the 3D vertical gate NAND array includes a first plurality of stacks of semiconductor material strips, the plurality of level select gate lines include a second plurality of stacks of gate material strips, and the first plurality of stacks is interleaved with, and coplanar with, the second plurality of stacks.

In one embodiment of the technology, the 3D vertical gate NAND array has memory cells in cross points of semiconductor strips in a plurality of stacks, and a plurality of word lines.

One aspect of the technology is a memory device, comprising a NAND string in a semiconductor material strip; a first plurality of word lines arranged over the NAND string, and a pair of gate material strips. The word lines of the first plurality of word run along a first direction. The pair of gate material strips is arranged to be coplanar with the NAND string, and arranged to run parallel along both sides of the NAND string in a second direction perpendicular to the first direction. The pair of gate material strips is configured as a gate for part of the semiconductor material strip.

One embodiment of the technology further comprises control circuitry applying a bias arrangement to the pair of gate material strips to act as the gate for the part of the semiconductor material strip.

One aspect of the technology is a memory device, comprising a first plurality of stacks of semiconductor material strips, a first plurality of word lines; a second plurality of stacks of gate material strips on the substrate interleaved with, and coplanar with, the first plurality of stacks, and control circuitry. the second plurality of stacks is configured as gates for the first plurality of stacks.

One embodiment of the technology further comprises control circuitry that applies a plurality of bias arrangements to the second plurality of stacks to control the second plurality of stacks as gates for the first plurality of stacks.

The word lines are arranged orthogonally over, and have surfaces conformal with, the first plurality of stacks, such that a 3D array of memory elements is established at cross-points between surfaces of the first plurality of stacks and the plurality of word lines.

In one embodiment of the technology, the first plurality of stacks of semiconductor material strips includes: a first length along which the plurality of word lines are arranged orthogonally over, and a second length adjacent to the first length, along which no word lines are arranged orthogonally over. The second plurality of stacks is interleaved with the first plurality of stacks along at least part of the second length but not along the first length.

One embodiment of the technology further comprises a lateral stack of gate material strips on the substrate. The lateral is perpendicular to the second plurality of stacks. The second plurality of stacks extends from the lateral stack of gate material strips.

In one embodiment of the technology, a plurality of planes of gate material strips separated by insulating material are included in: (i) stacks in the second plurality of stacks of gate material strips, and (ii) the lateral stack of gate material strips. Gate material strips in different stacks of the second plurality of stacks and at a same plane of the plurality of planes, are electrically interconnected to each other by a gate material strip in the lateral stack at the same plane.

In one embodiment of the technology, the lateral stack of gate material strips has an outer portion proximate to the second plurality of stacks, and an inner portion separated from the second plurality of stacks by the outer portion. The outer portion includes a plurality of planes of gate material strips separated by insulating material, and an inner portion filled with insulating material.

One embodiment of the technology further comprises a third plurality of stacks of semiconductor material strips, a second plurality of word lines, and a fourth plurality of stacks of gate material strips interleaved with the third plurality of stacks. The fourth plurality of stacks is configured as gates for the fourth plurality of stacks, The lateral stack has first and second sides on opposite sides of the lateral stack. The first side of the lateral stack faces the first plurality of stacks, the second plurality of stacks, the first plurality of word line. The second plurality of stacks extends from the first side of the lateral stack of gate material strips.

The second side of the lateral stack faces the third plurality of stacks, the fourth plurality of stacks, the second plurality of word lines. The fourth plurality of stacks extends from the second side of the lateral stack of gate material strips.

The second plurality of word lines is arranged orthogonally over, and has surfaces conformal with, the third plurality of stacks, such that another 3D array of memory elements is established at cross-points between surfaces of the third plurality of stacks and the second plurality of word lines.

In one embodiment of the technology, stacks in the second plurality of stacks are at a first plurality of positions along a length of the lateral stack. Stacks in the fourth plurality of stacks are at the first plurality of positions along the length of the lateral stack.

In one embodiment of the technology, stacks in the second plurality of stacks are at a first plurality of positions along a length of the lateral stack. Stacks in the fourth plurality of stacks are at a second plurality of positions along the length of the lateral stack. The first plurality of positions is staggered relative to the second plurality of positions.

In one embodiment of the technology, a plurality of planes of gate material strips separated by insulating material are included in: (i) stacks in the second plurality of stacks of gate material strips, and (ii) the lateral stack of gate material strips. The control circuitry selects memory cells at a particular plane of the plurality of planes in the first plurality of stacks, by applying a first one of the plurality of bias arrangements to the particular plane in the second plurality of stacks, and a second one of the plurality of bias arrangements to other planes in the second plurality of stacks.

In one embodiment of the technology, the second plurality of stacks is interleaved with the first plurality of stacks, such that one stack of the second plurality of stacks is in between two adjacent stacks of the first plurality of stacks.

In one embodiment of the technology, adjacent stacks in the first plurality of stacks have opposite stack orientations including a first stack orientation of bit line contact-to-source line contact and a second stack orientation of source line contact-to-bit line contact.

In one embodiment of the technology, the second plurality of stacks is interleaved with the first plurality of stacks, such that one stack of the second plurality of stacks is in between two adjacent stacks of the first plurality of stacks having a same stack orientation out of the first stack orientation and the second stack orientation.

In one embodiment of the technology, adjacent stacks in the first plurality of stacks have a same stack orientations include one of a first stack orientation of bit line contact-to-source line contact and a second stack orientation of source line contact-to-bit line contact.

In one embodiment of the technology, stacks in the first plurality of stacks of semiconductor material strips are parallel with each other, and stacks in the second plurality of stacks of gate material strips are parallel with each other.

In one embodiment of the technology, stacks in the first plurality of stacks of semiconductor material strips have first ends coupled to a source line voltage and second ends coupled to a bit line voltage.

Another aspect of the technology is a method of operating a 3D memory, including:
  selecting memory cells at a particular plane in a plurality of planes of a 3D memory array established at cross-points of a first plurality of word lines arranged orthogonally over, and having surfaces conformal with, a first plurality of stacks of semiconductor material strips, by applying a plurality of bias arrangements to a second plurality of stacks of gate material strips on the substrate interleaved with, and coplanar with, the first plurality of stacks.

Various embodiments of the technology are disclosed herein.

Another aspect of the technology is a manufacturing method, comprising:
  forming a first plurality of stacks of semiconductor material strips;
  forming a first plurality of word lines arranged orthogonally over, and having surfaces conformal with, the first plurality of stacks, such that a 3D array of memory elements is established at cross-points between surfaces of the first plurality of stacks and the plurality of word lines; and
  forming a second plurality of stacks of gate material strips interleaved with, and coplanar with, the first plurality of stacks, the second plurality of stacks configured as gates for the first plurality of stacks.

Other aspects and advantages of the present invention can be seen on review of the drawings, the detailed description and the claims, which follow.

DETAILED DESCRIPTION

A detailed description of embodiments is provided with reference to the Figures.

Figure 2:
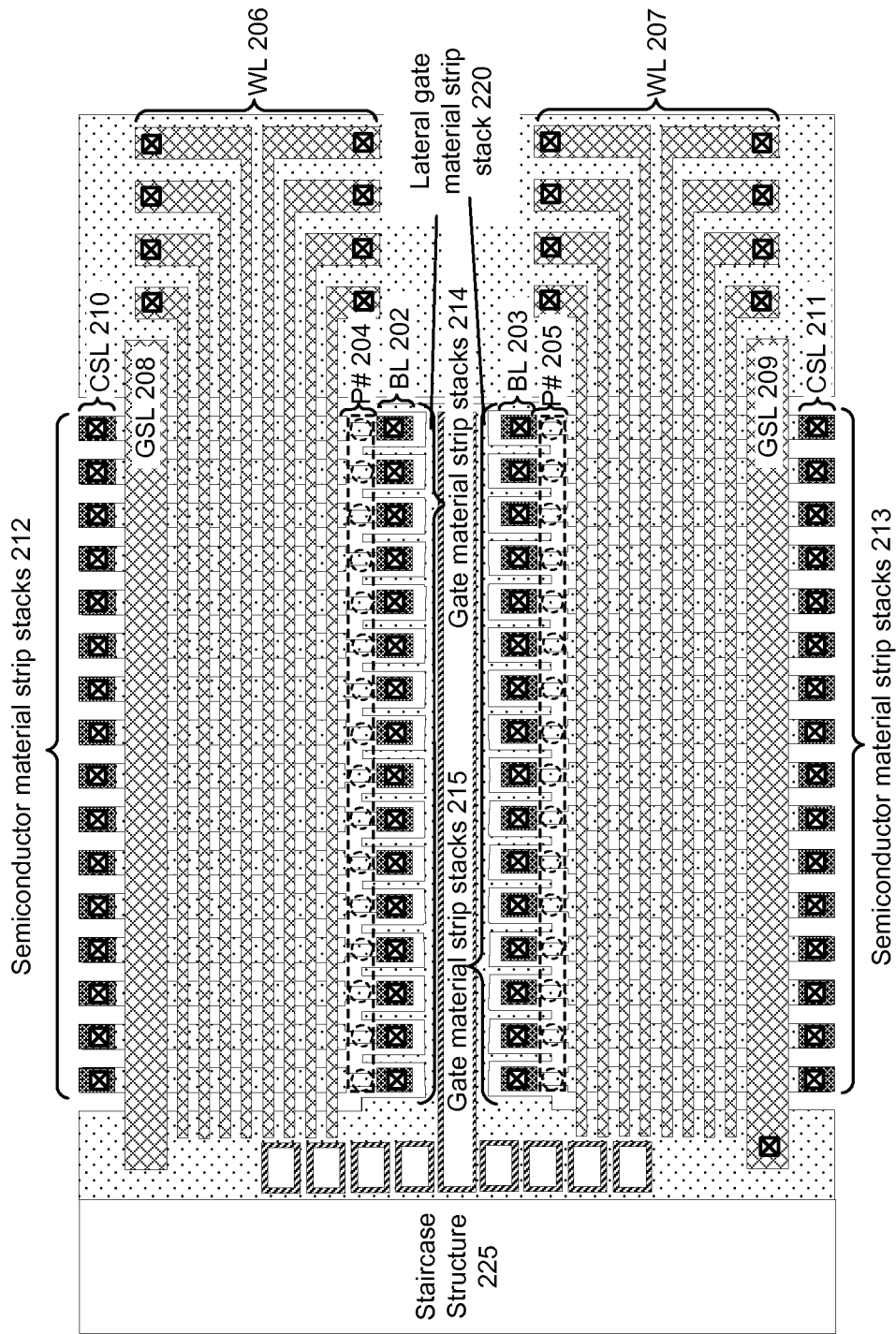
FIG. 2 is a top view of a 3D memory structure with stacks of semiconductor material strips with memory elements, interleaved with stacks of gate material strips, where the stacks of semiconductor material strips with memory elements share a common orientation of bit line-to-source line.

FIG. 2 is a top view of a 3D memory structure with stacks of semiconductor material strips with memory elements, interleaved with stacks of gate material strips, where the stacks of semiconductor material strips with memory elements share a common orientation of bit line-to-source line.

FIG. 2 includes a top array and a bottom array. The top array is described as follows. Semiconductor material strip stacks 212 include 16 stacks of semiconductor material strips. Within each stack, the semiconductor material strips alternate with dielectric strips. Semiconductor material strip stacks 212 are parallel to each other.

Word lines 206 include 8 word lines arranged orthogonally over, and having surfaces conformal with, the semiconductor material strip stacks 212. Word lines 206 are parallel to each other and run in a same direction. Other embodiments can include another number of word lines. A 3D array of memory elements is established at cross-points between surfaces of the semiconductor material strip stacks 212 and the word lines 206. Memory elements at a particular location along the semiconductor material strip stacks 212 are selected by applying a set of voltages to the word lines 206 that distinguishes one word line from the other word lines. The word lines can be referred to as vertical gates, because of their vertical orientation running up and down the sides of the semiconductor material strip stacks 212.

Ground select line 208 is also arranged orthogonally over, and has surfaces conformal with, the semiconductor material strip stacks 212.

Semiconductor material strip stacks 212 have opposite first and second ends. The first ends have common source line contact 210 for all semiconductor material strips in the respective stack. The second ends have bit line contact 202 for all semiconductor material strips in the respective stack. Memory elements on a particular stack of the semiconductor material strip stacks 212 are selected by applying a set of voltages to the bit line contacts 202 that distinguishes one stack of the semiconductor material strip stacks 212 from the other semiconductor material strip stacks 212.

Semiconductor material strip stacks 212 have a first length along which word lines 206 are arranged orthogonally over. This first length of the semiconductor material strip stacks 212 has a first width. Semiconductor material strip stacks 212 have a second length adjacent to the first length. No word lines are arranged over the second length of the semiconductor material strip stacks 212. The second length of the semiconductor material strip stacks 212 ends with bit line contacts 202. The second length has a second width narrower than the first width of the first length. The second length of each of the semiconductor material strip stacks 212 is indicated with a circle having a broken line. The second lengths of all semiconductor material strip stacks are collectively labeled P#204 and indicated collectively with a rectangle having a broken line. The P# label indicates multiple planes, and is explained in connection with FIG. 3.

Gate material strip stacks 214 are interleaved with the semiconductor material strip stacks 212. Gate material strip stacks 214 are parallel to each other, and run in a perpendicular direction to the direction in which the word lines run. In some embodiments, the gate material strip stacks 214 has the same material as the semiconductor material strip stacks 212, which simplifies fabrication. Alternatively, the gate material can be a conductor, such as highly doped semiconductor such as polysilicon or a metal. Gate material strip stacks 214 are perpendicular to, and extend from, lateral gate material strip stack 220. Gate material strip stacks 214 are interleaved along part of the lengths of semiconductor material strip stacks 212, stopping short of the word lines 206. Gate material strip stacks 214 are coplanar with semiconductor material strip stacks 212, such that stacks in the gate material strip stacks 214 and stacks in the semiconductor material strip stacks 212 have substantially the same vertical position. In some embodiments, gate material strip stacks 214 and lateral gate material strip stack 220 are formed of semiconductor material strips that alternate with dielectric strips, as with semiconductor material strip stacks 212. In such embodiments, gate material strip stacks 214 on the same plane are electrically interconnected by a gate material strip of the lateral gate material stack 220 in the same plane.

Whether or not the second lengths P#204 along the semiconductor material strip stacks 212 at a particular plane are conductive or nonconductive, is controlled by the gate material strip stacks 214 on the same plane. The gate material strip stacks 214 create a field effect that controls the conductivity in the second lengths P#204 in the semiconductor material strip stacks 212. A field effect can include accumulation, depletion, or inversion. Accordingly, depending on the field effect created by gate material strip stacks 214 to turn on and off the second lengths P#204 along the semiconductor material strip stacks 212, the second lengths P#204 along the semiconductor material strip stacks 212 can be doped n-type or p-type according to enhancement or depletion mode. If the second lengths P#204 on a plane of the semiconductor material strip stacks 212 are doped as enhancement mode, the second lengths P#204 conduct when the bias applied by the gate material strip stacks 214 on the same plane is greater than or equal to the threshold voltage of the second lengths P#204 if n-type, or is less than or equal to the threshold voltage of the second lengths P#204 if p-type. If the second lengths P#204 on a plane of the semiconductor material strip stacks 212 are doped as enhancement mode, the second lengths P#204 conduct when the bias applied by the gate material strip stacks 214 on the same plane is greater than or equal to the threshold voltage of the second lengths P#204 if n-type, or is less than or equal to the threshold voltage of the second lengths P#204 if p-type. If the second lengths P#204 on a plane of the semiconductor material strip stacks 212 are doped as depletion mode, the second lengths P#204 conduct when the bias applied by the gate material strip stacks 214 on the same plane is zero volts; the second lengths P#204 stop conducting when the bias applied by the gate material strip stacks 214 on the same plane is less than the threshold voltage of the second lengths P#204 if n-type, or greater than the threshold voltage of the second lengths P#204 if p-type.

For any single semiconductor material strip in any single stack of the semiconductor material strip stacks 212, a pair of gate material strips in gate material strip stacks 214 are coplanar with, and run parallel along both sides of the single semiconductor material strip. The pair of gate material strips are configured as a gate for part of the semiconductor material strip.

Each of the gate material strip stacks 214 does not have to be interleaved along the entirety of the adjacent second lengths P#204 along the semiconductor material strip stacks 212. Because electric fields fringe and spread, each of the gate material strip stacks 214 can control the adjacent second lengths P#204 along the semiconductor material strip stacks 212, despite the gate material strip stacks 214 extending partly rather than fully along the entirety of the adjacent second lengths P#204 along the semiconductor material strip stacks 212.

Memory elements on a particular plane of the semiconductor material strip stacks 212 are selected by applying a set of voltages to the gate material strip stacks 214. In turn, the gate material strip stacks 214 control the conductivity in second lengths P#204 along the semiconductor material strip stacks 212, that distinguishes one plane of the semiconductor material strip stacks 212 from the other planes of the semiconductor material strip stacks 212. A plane of the semiconductor material strip stacks 212 can be selected due to the gate material strip stacks 214 applying a field effect to adjacent second lengths P#204 on the selected plane and the absence of the field effect on adjacent second lengths P#204 on other planes, or vice versa.

Figure 1:
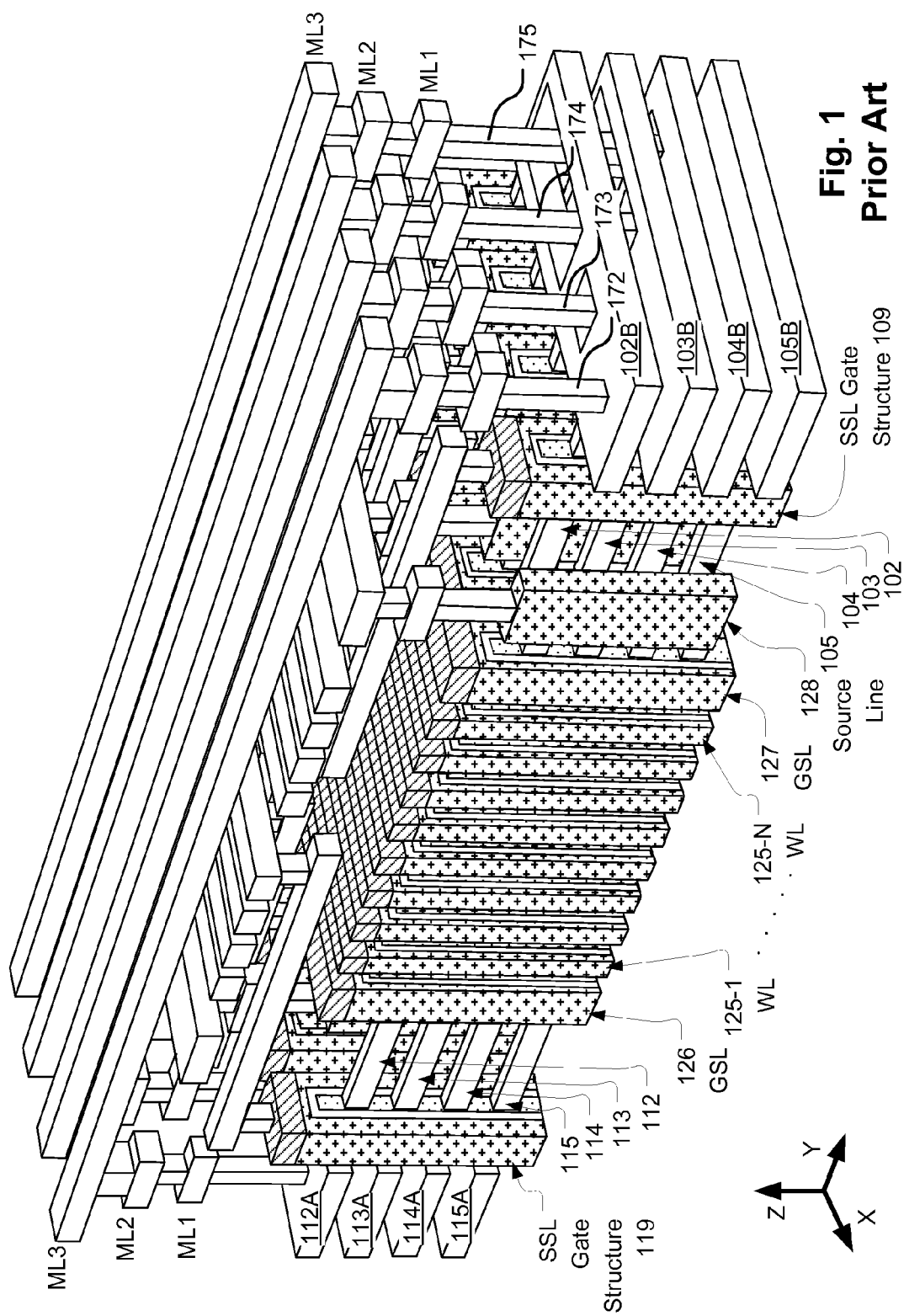
FIG. 1 is a perspective illustration of a 3D memory structure.

The staircase structure 225 routes the string select signals that select a particular plane of the semiconductor material strip stacks 212. One embodiment of the staircase structure can resemble the linking elements 112A, 113A, 114A, and 115A and linking elements 102B, 103B, 104B, and 105B of FIG. 1. Other embodiments can change the order of the linking elements and alter the shapes and configuration of the linking elements.

The string select signals are routed to the different planes of the gate material strip stacks 214. As described previously, the different planes of the gate material strip stacks 214 control the conductivity in second lengths P#204 along the semiconductor material strip stacks 212, that distinguishes memory elements on one plane of the semiconductor material strip stacks 212 from memory elements on the other planes of the semiconductor material strip stacks 212.

In combination, the word line signals, the bit line signals, and the string select line signals are sufficient to identify individual memory cells in the 3D memory array.

In addition to the top array just described, FIG. 2 also shows a bottom array described as follows. The bottom array includes semiconductor material strip stacks 213 that include 16 stacks of semiconductor material strips that alternate with dielectric strips. Word lines 207 include 8 word lines arranged orthogonally over, and having surfaces conformal with, the semiconductor material strip stacks 213. A 3D array of memory elements is established at cross-points between surfaces of the semiconductor material strip stacks 213 and the word lines 207. Ground select line 209 is also arranged orthogonally over, and has surfaces conformal with, the semiconductor material strip stacks 213.

Semiconductor material strip stacks 213 have opposite first and second ends. The first ends have common source line contact 211 for all semiconductor material strips in the respective stack. The second ends have bit line contact 203 for all semiconductor material strips in the respective stack.

Gate material strip stacks 215 are interleaved with the semiconductor material strip stacks 213. Gate material strip stacks 215 are perpendicular to, and extend from, lateral gate material strip stack 220.

The bottom array is otherwise similar to the top array in configuration, operation, and variations.

Figure 3:
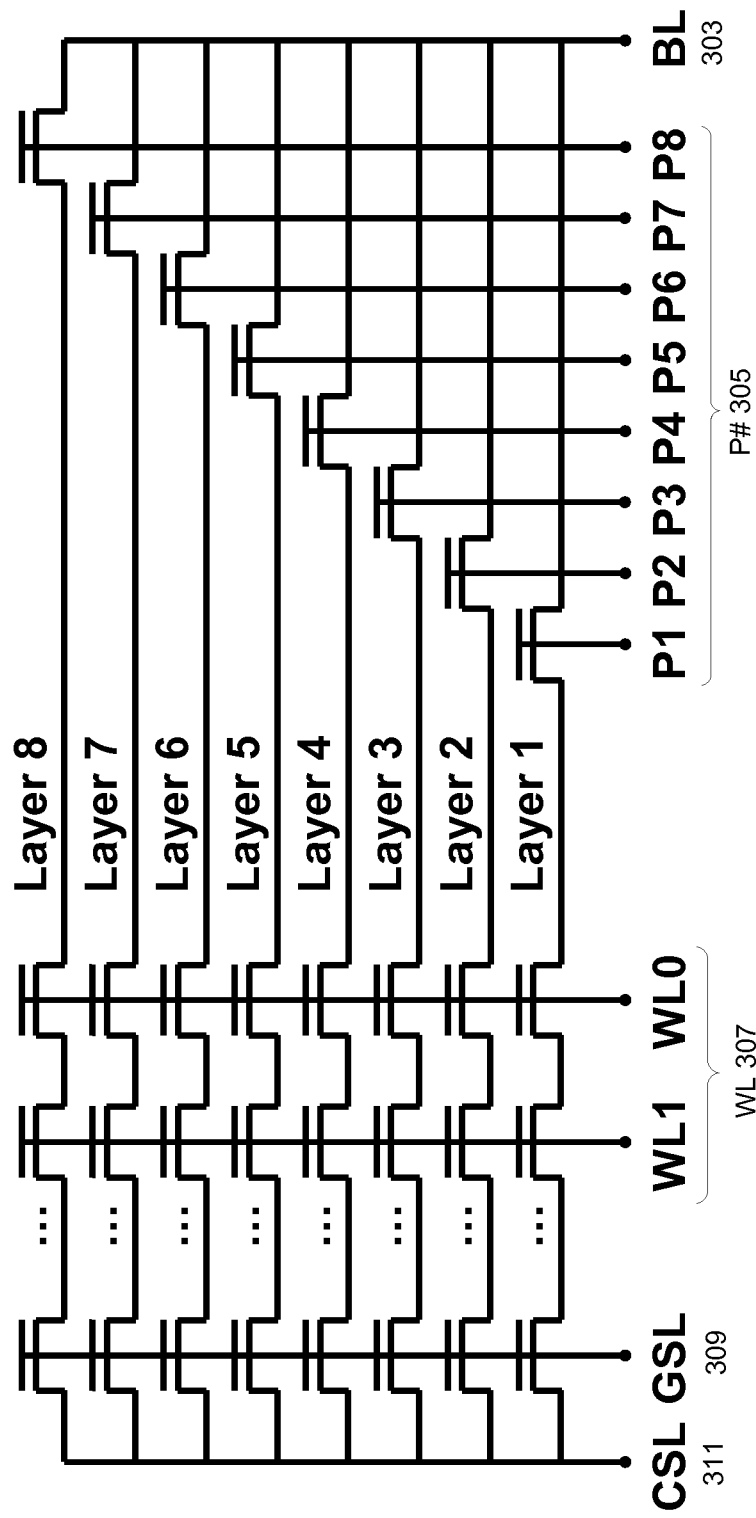
FIG. 3 is a circuit diagram representation of one of the stacks of semiconductor material strips of the 3D memory structure in FIG. 2.

FIG. 3 is a circuit diagram representation of one of the stacks of semiconductor material strips of the 3D memory structure in FIG. 2.

All of the stacks of semiconductor material strips 212 and 213 include multiple planes of semiconductor material strips separated by insulating material. For simplicity, a single stack of semiconductor material strips is shown.

Within the single stack, 8 planes of semiconductor material strips are separated by insulating material. Other embodiments include a different number of planes or semiconductor material strips. Within each plane in the stack, a NAND string includes the series-connected transistors CSL 311, GSL 309, WL 307 (including WL0, WL1, up to WL N−1), P#305, and BL 303. Other embodiments can use switches other than transistors. The transistors P1-P8 in FIG. 3, collectively labeled as P#305, select memory elements on a particular plane or semiconductor material strip. As described in connection with FIG. 2, the set of voltages applied to BL 303 distinguishes memory elements in a particular stack of semiconductor material strips from other stack of semiconductor material strips, and the set of voltages applied to WL 307 distinguishes memory elements accessed by a particular word line from memory cells accessed by other word lines.

As described in connection with FIG. 2, gate material strip stacks 214 on the same plane are electrically interconnected by a gate material strip of the lateral gate material stack 220 in the same plane. A single one of the transistors P1-P8 in FIG. 3 selects the particular plane of transistors in all of the semiconductor material strip stacks 212. The gate of a single one of the transistors P1-P8 in FIG. 3 corresponds to all of the gate material strip stacks 214 on the same plane. The body of a single one of the transistors P1-P8 in FIG. 3 corresponds to all of the second lengths P#204 on the same plane in semiconductor material strip stacks 212.

For other stacks of semiconductor strips, the same circuit as in FIG. 3 is copied. The same CSL 311, GSL 309, WL 307, and P#305 is shared across all of the gate material strip stacks 214. However, BL 303 is distinct among the different stacks of gate material strip stacks 214, because the set of voltages applied to the different BL 303s distinguishes memory cells in a particular stack of the gate material strip stacks 214 from the other stacks of the gate material strip stacks 214.

Figure 4:
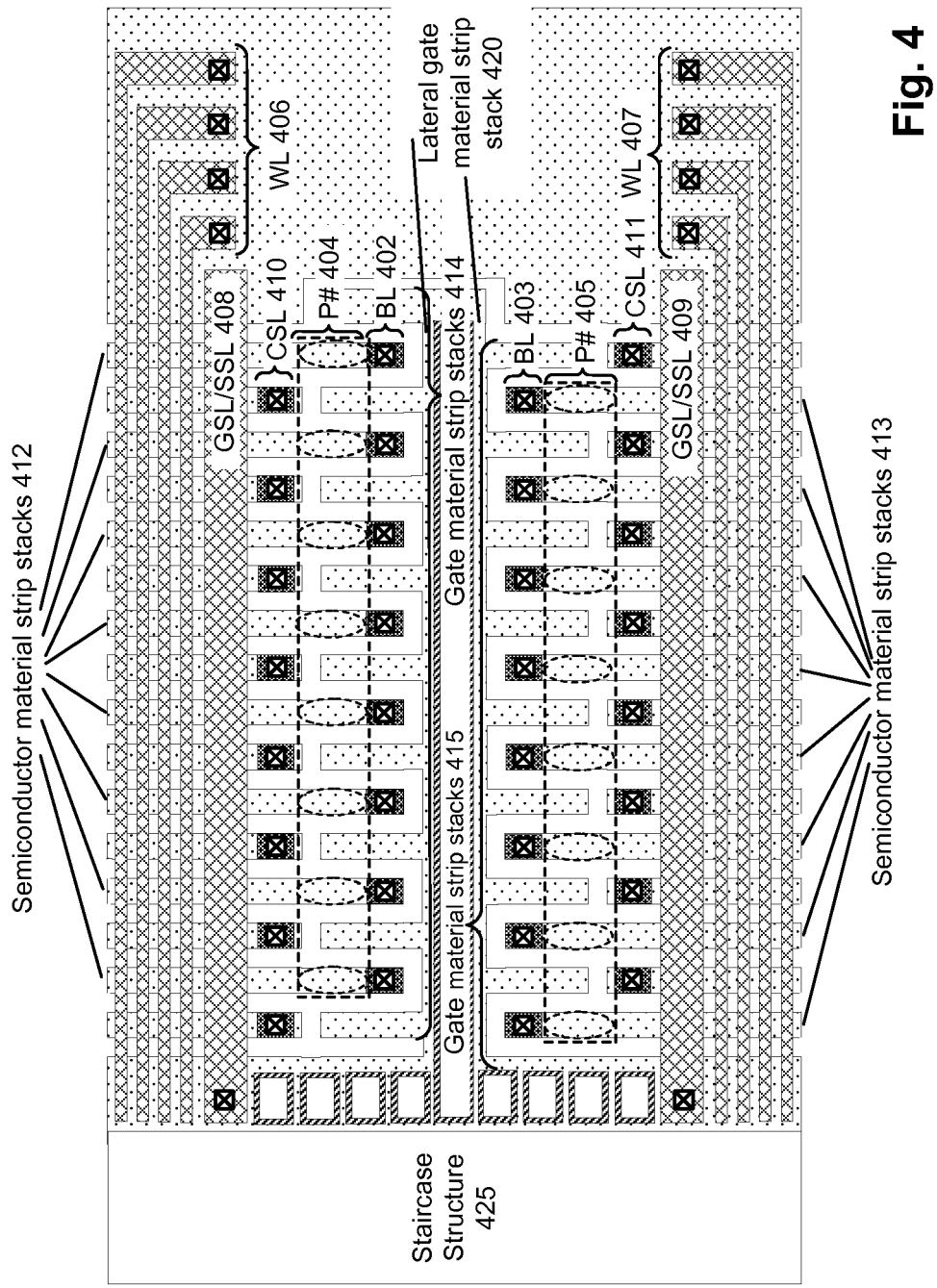
FIG. 4 is a top view of a 3D memory structure with stacks of semiconductor material strips with memory elements, interleaved with stacks of gate material strips, where the stacks of semiconductor material strips with memory elements have alternating orientations of bit line-to-source line and source line-to-bit line.

FIG. 4 is a top view of a 3D memory structure with stacks of semiconductor material strips with memory elements, interleaved with stacks of gate material strips, where the stacks of semiconductor material strips with memory elements have alternating orientations of bit line-to-source line and source line-to-bit line.

FIG. 4 is generally similar to FIG. 2 in configuration, operation, and variations, but with a top half array and a bottom half array, and other differences described below. FIG. 2 includes a top array with complete bit line-to source line semiconductor material strip stacks, and a bottom array with complete bit line-to source line semiconductor material strip stacks. FIG. 4 include a top half array and a bottom half array. Complete bit line-to source line semiconductor material strip stacks are formed by combining multiple instances of FIG. 4, such that the top half array in a first instance of FIG. 4 combines with the bottom half array in a second instance of FIG. 4.

Semiconductor material strip stacks 412 include 8 stacks of semiconductor material strips, including every other stack of semiconductor material strips. In FIG. 2, memory strings in adjacent stacks shared the same bit line end-to-source line end orientation. In FIG. 4, memory cell strings in adjacent stacks alternate between a bit line end-to-source line end orientation and a source line end-to-bit line end orientation. Semiconductor material strip stacks 412 include the stacks with bit line ends interleaved with the gate material strip stacks 414. Semiconductor material strip stacks 412 do not include the stacks with source line ends that are not interleaved with the gate material strip stacks 414.

Semiconductor material strip stacks 412 have opposite first and second ends. The first ends have bit line contact 402 for all semiconductor material strips in the respective stack. The second ends have common source line contacts for all semiconductor material strips in the respective stack.

Copied instances of the memory architecture of FIG. 4 are combined in tile fashion, to form complete semiconductor material strip stacks with a bit line end and a common source line end. In a first instance of FIG. 4, in the top half array, semiconductor material strip stacks 412 include the stacks with bit line contacts 402 but no common source line contacts. A second instance of FIG. 4 is copied and placed in tile fashion adjacent to the top edge of the first instance of FIG. 4. In this second instance of FIG. 4, the bottom half array includes semiconductor material strip stacks including common source line contacts 411 but no bit line contacts. Semiconductor material strip stacks 412 which include bit line contacts 402 in the top half array of the first instance of FIG. 4 end at the top edge of the first instance of FIG. 4, and then continue into the bottom edge of the second instance of FIG. 4 to connect with semiconductor material strip stacks which include common source line contacts 411 in the bottom half array of the second instance of FIG. 4. Thus, complete semiconductor material strip stacks with a bit line end and a common source line end are formed by combining multiple instances of FIG. 4.

Similarly, other semiconductor material strip stacks in the top half array of FIG. 4 include the stacks with common source line contacts 410 but no bit line contacts. As discussed above, the second instance of FIG. 4 is copied and placed in tile fashion adjacent to the top edge of FIG. 4. In this second instance of FIG. 4, the bottom half array includes semiconductor material strip stacks including bit line contacts 403 but no common source line contacts. Semiconductor material strip stacks which include common source line contacts 410 in the top half array of the first instance of FIG. 4 end at the top edge of the first instance of FIG. 4, and then continue into the bottom edge of the second instance of FIG. 4 to connect with semiconductor material strip stacks which include bit line contacts 403 in the bottom half array of the second instance of FIG. 4. Again, complete semiconductor material strip stacks with a bit line end and a common source line end are formed by combining multiple instances of FIG. 4.

Word lines 406 include 4 word lines arranged orthogonally over, and having surfaces conformal with, the semiconductor material strip stacks in the top half array. A 3D array of memory elements is established at cross-points between surfaces of the semiconductor material strip stacks in the top half array and the word lines 406.

Word lines 407 include 4 word lines arranged orthogonally over, and having surfaces conformal with, the semiconductor material strip stacks in the bottom half array. A 3D array of memory elements is established at cross-points between surfaces of the semiconductor material strip stacks in the bottom half array and the word lines 407.

By combining multiple instances of FIG. 4 as discussed above, the word lines 406 and word lines 407 collectively form the set of word lines to access a full memory array.

GSL/SSL 408 is arranged orthogonally over, and has surfaces conformal with, the semiconductor material strip stacks in the top half array. GSL/SSL 409 is arranged orthogonally over, and has surfaces conformal with, the semiconductor material strip stacks in the bottom half array. In instances where the GSL/SSL 408 or GSL/SSL 409 is proximate to the common source line contact of a particular strip stack, the GSL/SSL 408 or GSL/SSL 409 acts as a ground select line. In instances where the GSL/SSL 408 or GSL/SSL 409 is proximate to the bit line contact of a particular strip stack, the GSL/SSL 408 or GSL/SSL 409 acts as a string select line.

Semiconductor material strip stacks 412 have a first length along which word lines 206 are arranged orthogonally over. (As discussed above, because multiple instances of FIG. 4 are tiled together to form complete semiconductor strips stacks having a bit line end and a source line end, with word line in the middle.) This first length of the semiconductor material strip stacks 412 has a first width. Semiconductor material strip stacks 412 have a second length adjacent to the first length. No word lines (nor GSL/SSL lines) are arranged over the second length of the semiconductor material strip stacks 412. The second length of the semiconductor material strip stacks 412 ends with bit line contacts 402. The second length has a second width narrower than the first width of the first length. The second length of each of the semiconductor material strip stacks 412 is indicated with an oval having a broken line. The second lengths of all semiconductor material strip stacks are collectively labeled P#404 and indicated collectively with a rectangle having a broken line. The P# label indicates multiple planes, and is explained in connection with FIG. 5.

Gate material strip stacks 414 are interleaved with the semiconductor material strip stacks 412. Gate material strip stacks 414 are perpendicular to, and extend from, lateral gate material strip stack 420. Gate material strip stacks 414 are interleaved along part of the lengths of semiconductor material strip stacks 412, stopping short of the word lines 406 (and the GSL/SSL 408). As already mentioned, the operation of FIG. 4 is generally similar to FIG. 2, including the control of whether or not the second lengths P#404 along the semiconductor material strip stacks 412 at a particular plane are conductive or nonconductive, the gate material strip stacks 414 on the same plane.

In FIG. 4, memory cell strings in adjacent stacks alternate between a bit line end-to-source line end orientation and a source line end-to-bit line end orientation. Stacks with one of these orientations are included in semiconductor material strip stacks 412, and stacks with the other orientation are not included in semiconductor material strip stacks 412. Described differently, the gate material strip stacks 414 can control conductivity on other stacks that are interleaved with the gate material strip stacks 414.

The staircase structure 425 routes the string select signals that select a particular plane of the semiconductor material strip stacks 412.

In addition to the top half array just described in the context of tiling multiple instances of FIG. 4, FIG. 4 also shows a bottom array described as follows. The bottom array includes semiconductor material strip stacks 413 that include 8 stacks of semiconductor material strips that alternate with dielectric strips. Word lines 407 include 8 word lines arranged orthogonally over, and having surfaces conformal with, the semiconductor material strip stacks 413. A 3D array of memory elements is established at cross-points between surfaces of the semiconductor material strip stacks 413 and the word lines 407.

Gate material strip stacks 415 are interleaved with the semiconductor material strip stacks 413. Gate material strip stacks 415 are perpendicular to, and extend from, lateral gate material strip stack 420.

The bottom half array is otherwise similar to the top half array in configuration, operation, and variations.

Figure 5:
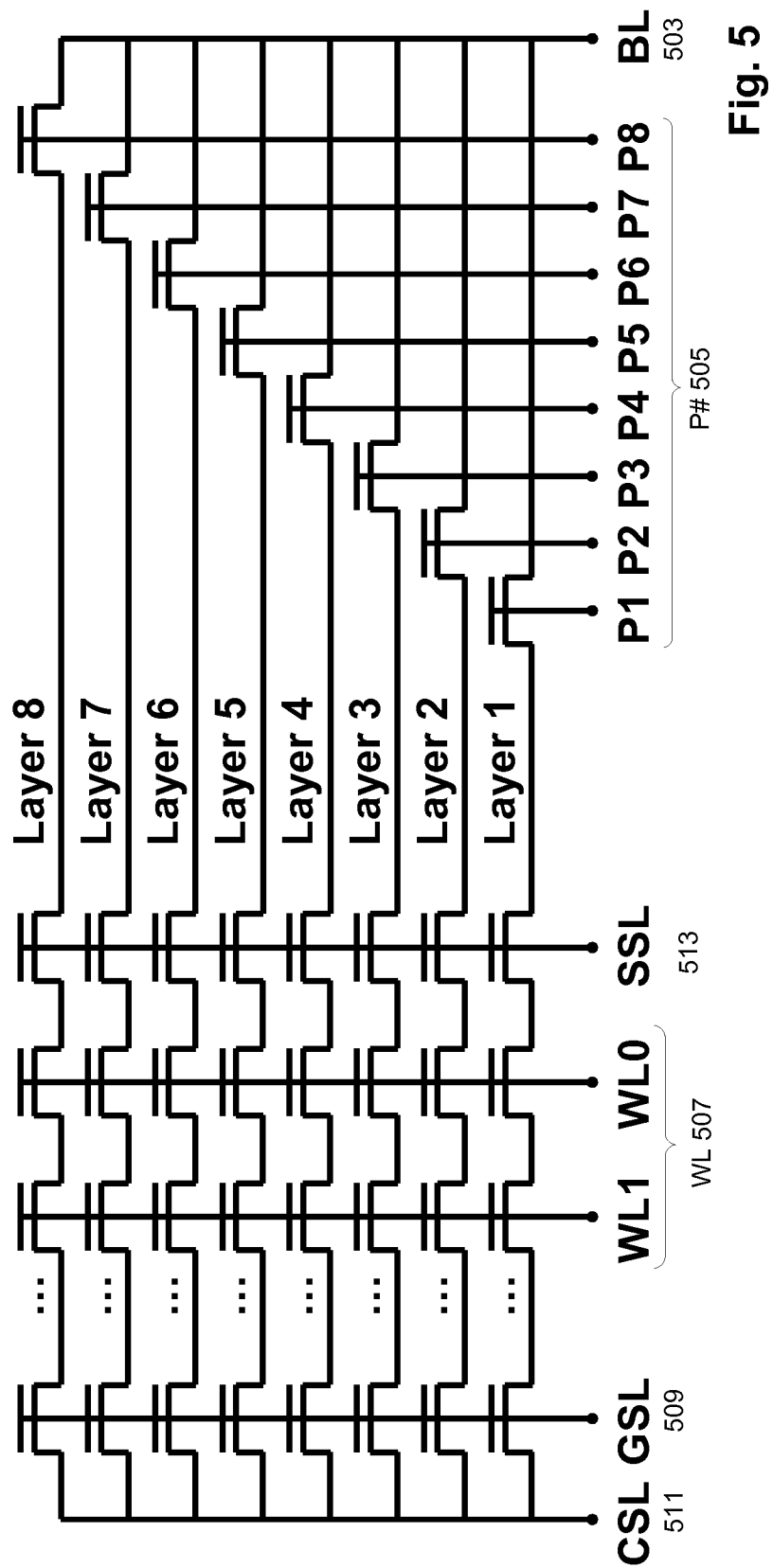
FIG. 5 is a circuit diagram representation of one of the stacks of semiconductor material strips of the 3D memory structure in FIG. 4.

FIG. 5 is a circuit diagram representation of one of the stacks of semiconductor material strips of the 3D memory structure in FIG. 4.

FIG. 5 is generally similar to FIG. 3 in configuration, operation, and variations, with differences described below.

All of the stacks of semiconductor material strips 412 and 413 include multiple planes of semiconductor material strips separated by insulating material. For simplicity, a single stack of semiconductor material strips is shown in FIG. 5. A complete stack of semiconductor material strips is formed by combining multiple instances of FIG. 4, such that a stack of semiconductor material strips includes a bit line end and a common source line end.

Within the single stack, 8 planes of semiconductor material strips are separated by insulating material. Within each plane in the stack, a NAND string includes the series-connected transistors CSL 511, GSL 509, WL 507 (including WL0, WL1, up to WL N–1), P#505, and BL 503. The transistors P1-P8, collectively labeled as P#505, select memory elements on a particular plane or semiconductor material strip.

As described in connection with FIG. 4, gate material strip stacks 414 on the same plane are electrically interconnected by a gate material strip of the lateral gate material stack 420 in the same plane. A single one of the transistors P1-P8 in FIG. 5 selects the particular plane of transistors in all of the semiconductor material strip stacks 412. The gate of a single one of the transistors P1-P8 in FIG. 5 corresponds to all of the gate material strip stacks 414 on the same plane. The body of a single one of the transistors P1-P8 in FIG. 5 corresponds to all of the second lengths P#404 on the same plane in semiconductor material strip stacks 412.

As explained in FIG. 4, memory cell strings in adjacent stacks alternate between a bit line end-to-source line end orientation and a source line end-to-bit line end orientation. The semiconductor material strips which include second lengths controlled by a same one of the transistors P1-P8 in FIG. 5 all share the same orientation, either bit line end-to-source line end orientation and a source line end-to-bit line end orientation.

For memory cell strings with the opposite orientation, an additional set of transistors P1-P8 in an additional instance of FIG. 5 provide control of distinguishing a memory elements on a particular plane from other memory elements on other planes. As explained in connection with FIG. 4, complete bit line-to source line semiconductor material strip stacks are formed by combining multiple instances of FIG. 4. The additional set of transistors P1-P8 as in the additional instance FIG. 5 is in an additional instance of FIG. 4.

FIGS. 6-14 are steps in an example process flow to make the 3D memory structure in FIG. 2.

Figure 6:
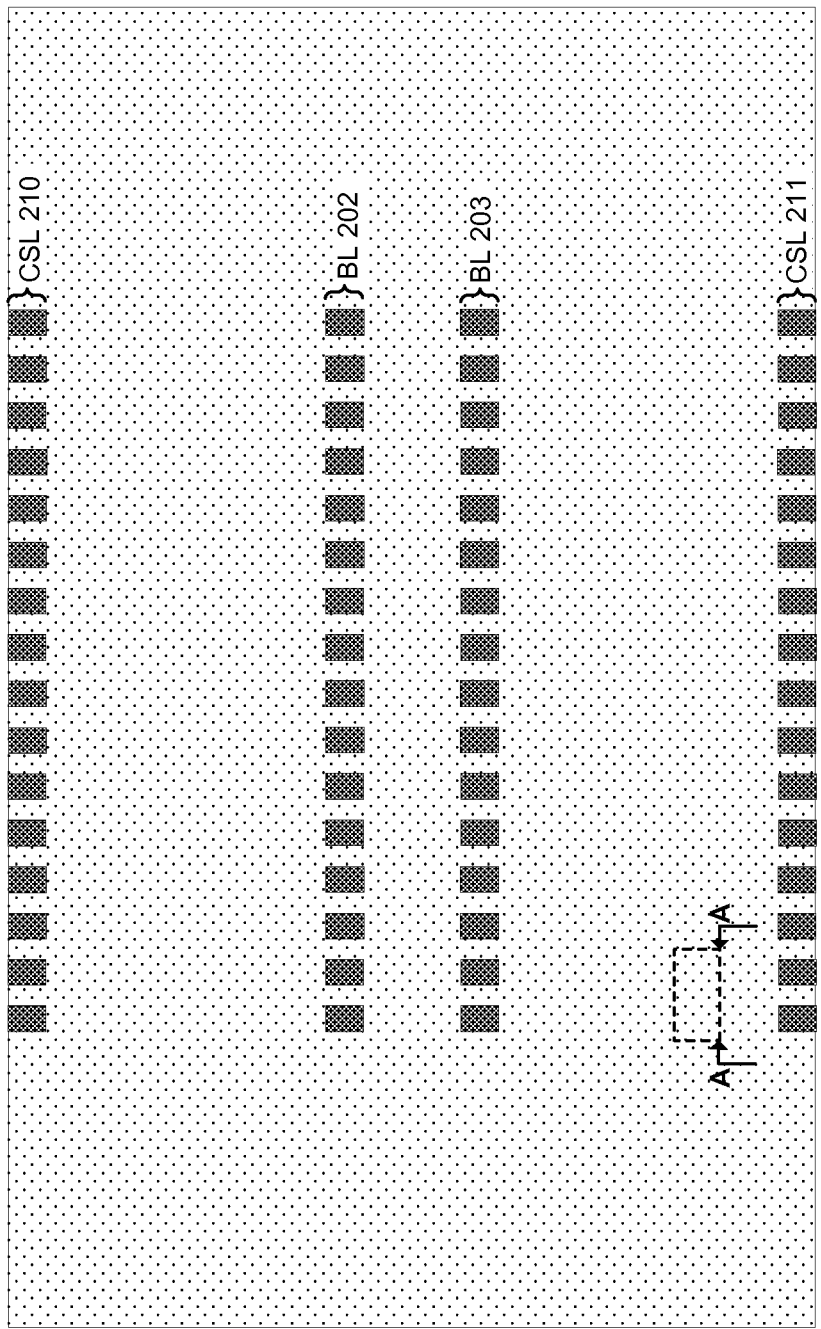
FIGS. 6-14 are steps in an example process flow to make the 3D memory structure in FIG. 2.

FIG. 6 is a top view of a stack of semiconductor material layers. The semiconductor layers alternate with dielectric layers.

Conductive plugs or other interlayer connectors are formed through the stack of semiconductor material layers. The conductive plugs subsequently become part of the bit line contacts 202, bit line contacts 203, common source line contacts 210, and common source line contacts 211.

Figure 7:
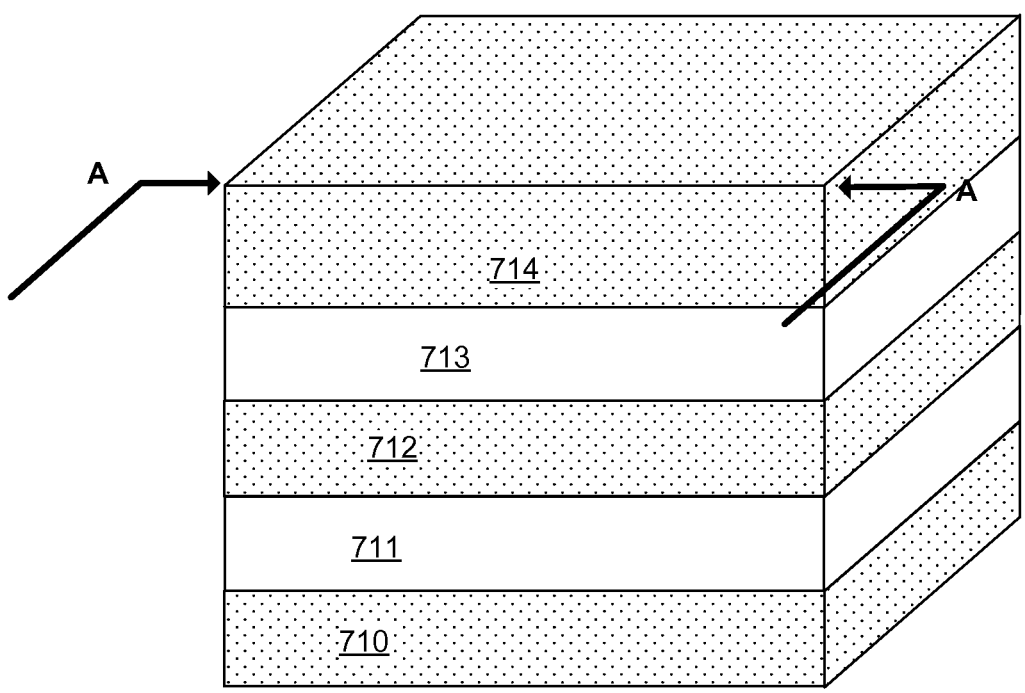

FIG. 6 includes a dashed rectangle with view line arrows A-A, which indicates the planar portion of FIG. 6 shown in the 3D perspective view of FIG. 7, and the viewing perspective of FIG. 6 taken in FIG. 7.

FIG. 7 is a 3D perspective view of a portion of FIG. 6, showing a structure which results from alternating deposition of insulating layers 710, 712, 714 and conductive layers 711, 713 formed using doped semiconductors for example in a blanket deposition in the array area of a chip. Although only 2 conductive layers are shown, there can be 8 conductive layers to result in 8 planes of memory elements, or another quantity. View line arrows A-A correspond to the view line arrows A-A in FIG. 6.

The semiconductor material layers can be formed from semiconductor of various doping such as p-type or n-type silicon, monocrystalline semiconductor of various doping such as p-type or n-type, or polycrystalline semiconductor of various doping such as p-type or n-type.

A typical doping concentration for an embodiment with n-type semiconductor strips can be around $10^{18}/cm^3$, with usable embodiments likely in the range of $10^{17}/cm^3$ to $10^{19}/cm^3$. The use of n-type semiconductor strips can be particularly beneficial in junction-free embodiments to improve conductivity along the NAND strings and thereby allowing higher read current.

Insulating layers 710, 712, 714 can be implemented for example using one or more of a group consisting of P-MSQ (polymethylsilsesquioxane), SiLK, fluorine-doped oxide, carbon-doped oxide, porous oxide, and spin-on organic polymeric dielectric, where fluorine-doped oxide includes SiOF (fluorinated silicate glass), and carbon-doped oxide includes SiOC (carbonated silicate glass), black diamond, coral, and aurora. These layers can be formed in a variety of ways, including low pressure chemical vapor deposition LPCVD processes available in the art.

Figure 8:
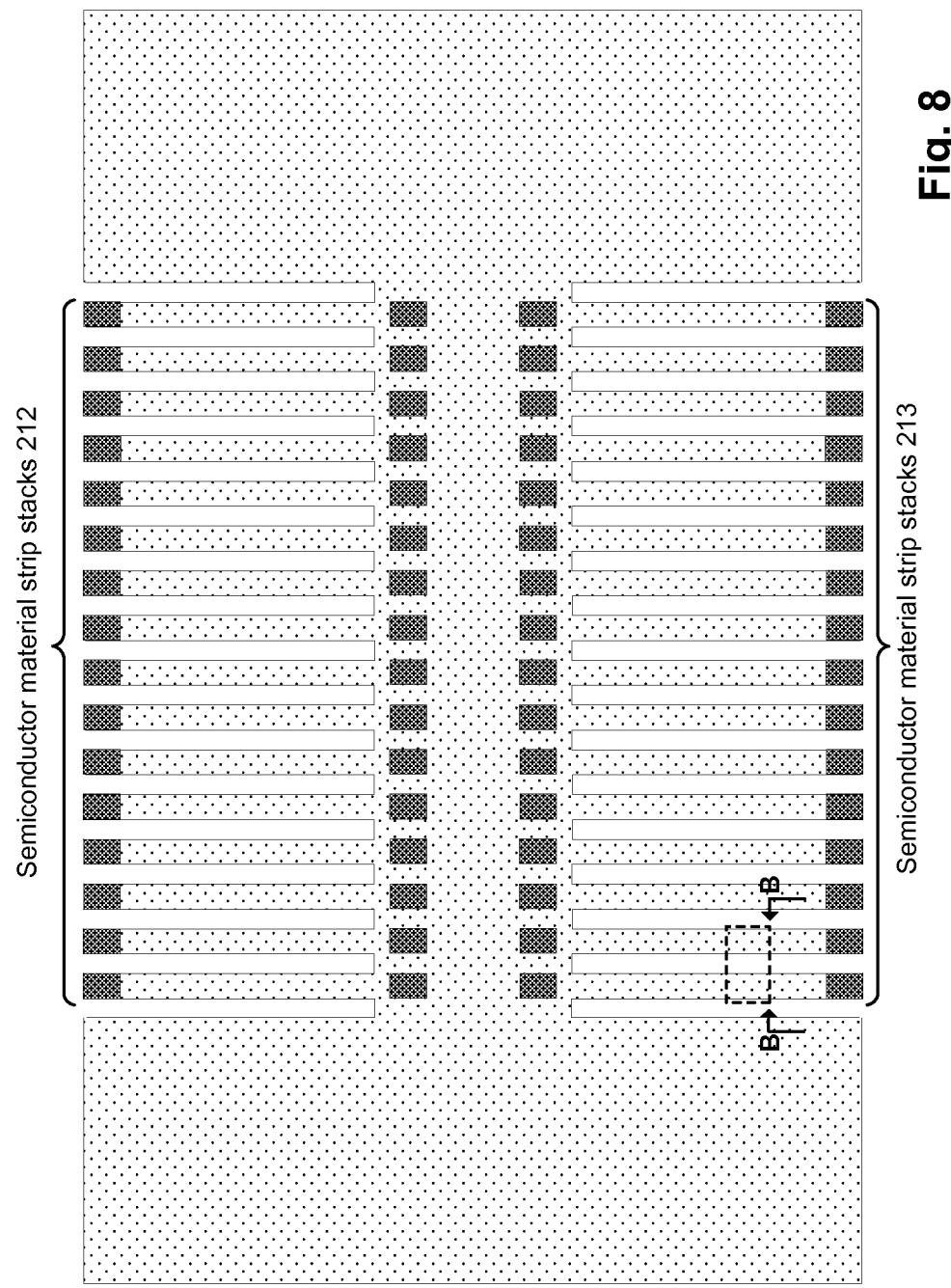

FIG. 8 is a top view of the stacks of semiconductor material strips. Semiconductor material strip stacks 212 and semiconductor material strip stacks 213 have opposite orientations. The outer ends of the semiconductor material strip stacks 212 and semiconductor material strip stacks 213 are the respective common source line plugs. The inner ends of the semiconductor material strip stacks 212 and semiconductor material strip stacks 213 stop short of the respective bit line plugs.

Figure 9:
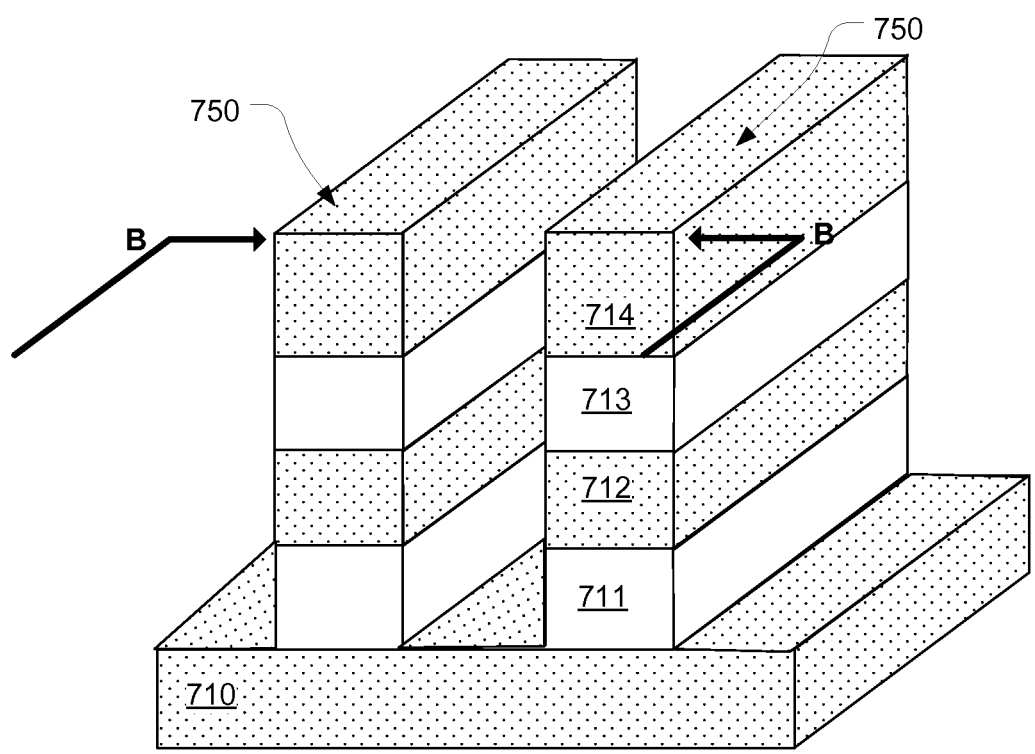

FIG. 8 includes a dashed rectangle with view line arrows B-B, which indicates the planar portion of FIG. 8 shown in the 3D perspective view of FIG. 9, and the viewing perspective of FIG. 8 taken in FIG. 9.

FIG. 9 is a 3D perspective view of a portion of FIG. 8, showing the result of a lithographic patterning step used to define a plurality of ridge-shaped stacks 750 of conductive strips, where the conductive strips are implemented using the material of the conductive layers 711, 713, and separated by the insulating layers 712, 714. Deep, high aspect ratio trenches can be formed in the stack, supporting many layers, using lithography based processes applying a carbon hard mask and reactive ion etching. View line arrows B-B correspond to the view line arrows B-B in FIG. 8.

Figure 10:
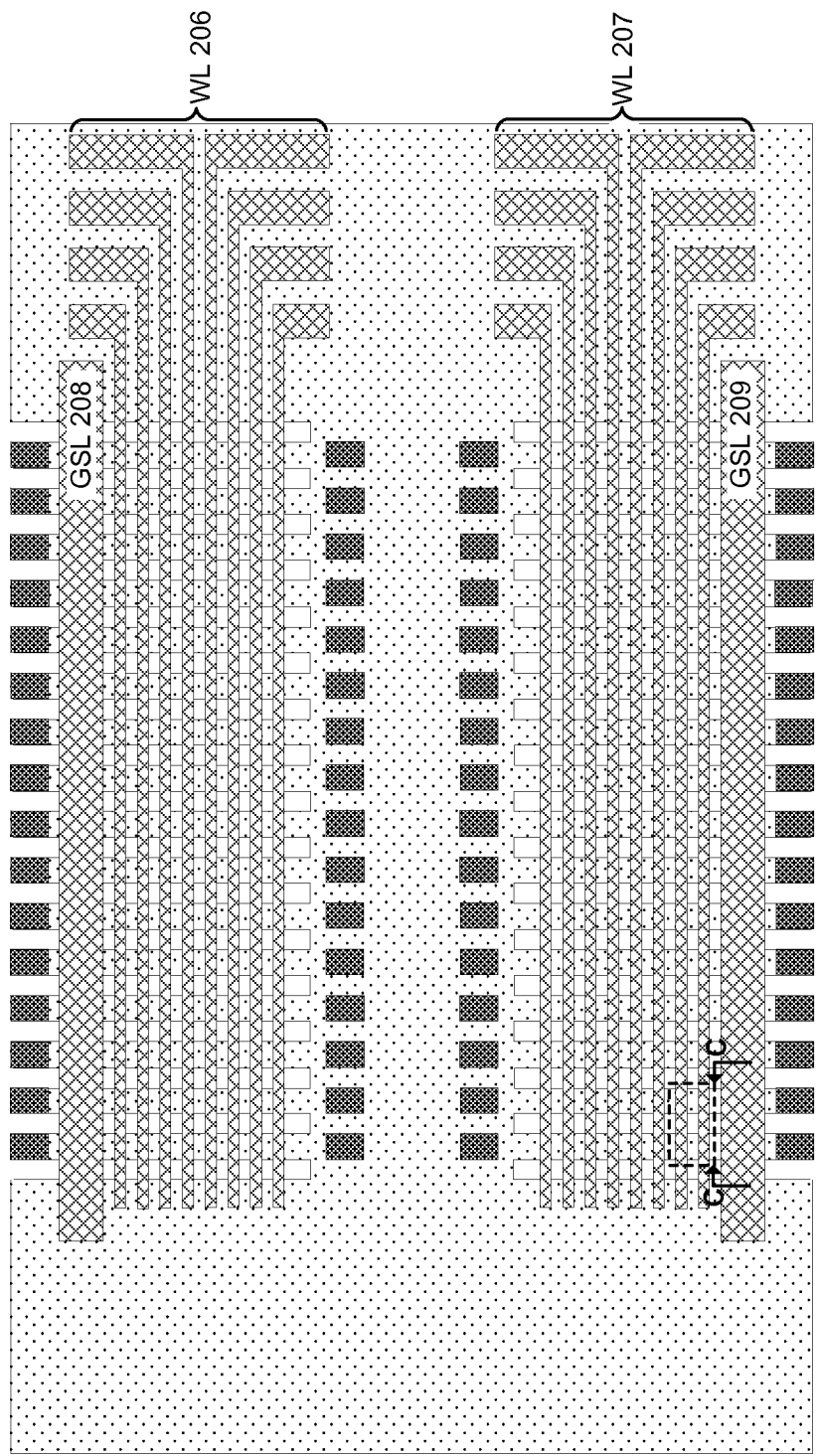

FIG. 10 is a top view of word lines over the stacks of semiconductor material strips. Word lines 206 cover a middle length of the semiconductor material strip stacks in the upper array. Ground select line 208 covers part of the semiconductor material strip stacks in between the word lines 206 and the common source line contacts. Word lines 207 cover a middle length of the semiconductor material strip stacks in the lower array. Ground select line 209 covers part of the semiconductor material strip stacks in between the word lines 207 and the common source line contacts.

Figure 11:
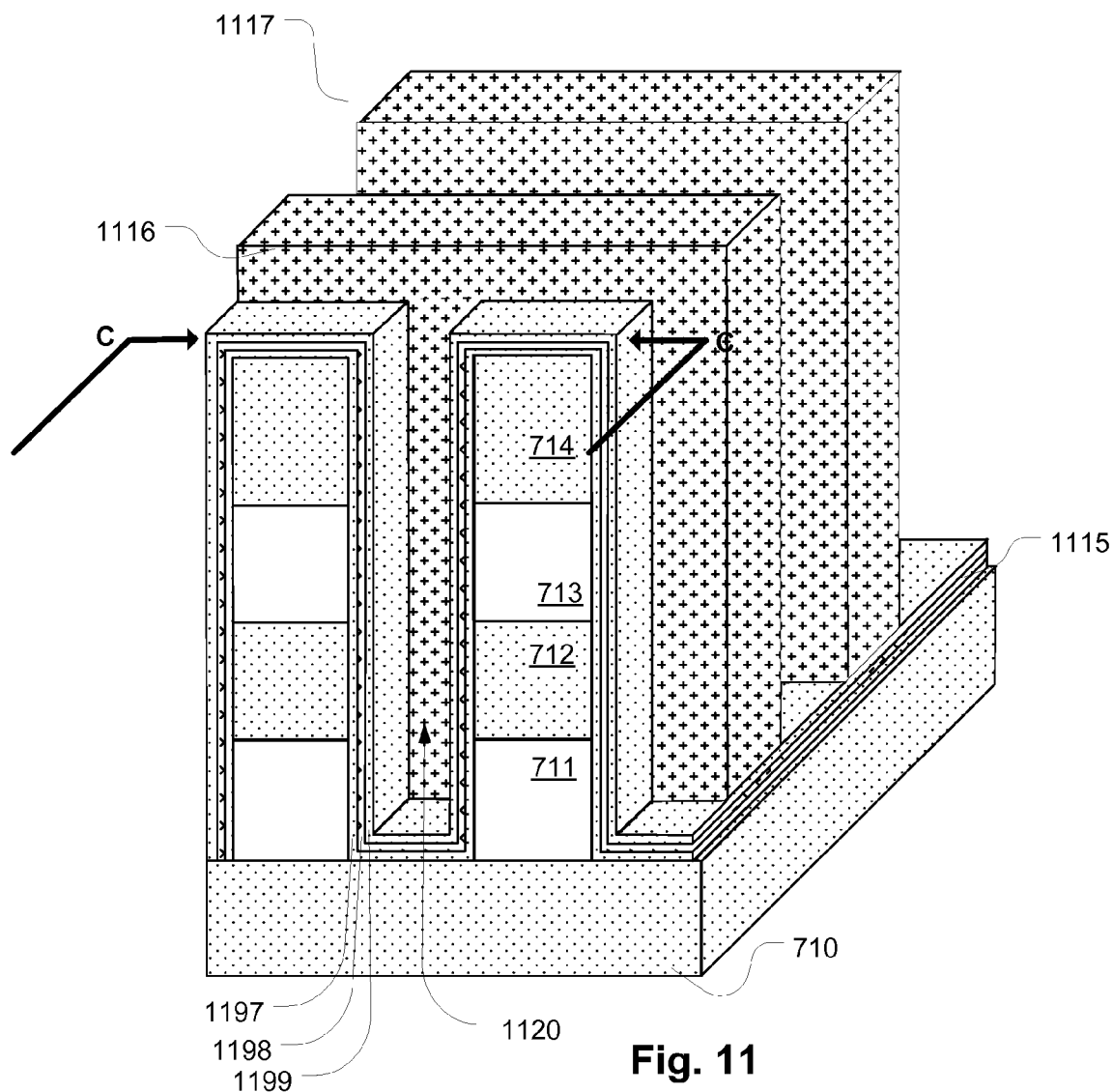

FIG. 10 includes a dashed rectangle with view line arrows C-C, which indicates the planar portion of FIG. 10 shown in the 3D perspective view of FIG. 11, and the viewing perspective of FIG. 11 taken in FIG. 10.

FIG. 11 is a 3D perspective view of a portion of FIG. 10, showing word lines over memory material and the stacks of semiconductor material strips.

A layer 1115 of memory material, such as a dielectric charge trapping structure, coats the plurality of stacks of semiconductor strips in this example. A plurality of word lines 1116, 1117 is arranged orthogonally over the plurality of stacks of semiconductor strips. The word lines 1116, 1117 have surfaces conformal with the plurality of stacks of semiconductor strips, filling the trenches (e.g. 1120) defined by the plurality of stacks, and defining a multi-layer array of interface regions at cross-points between side surfaces of the semiconductor strips 711-714 on the stacks and word lines 1116, 1117. The word lines 1116, 1117 can be a semiconductor material with the same or a different conductivity type as the semiconductor material strips. For example, the semiconductor strips can be made using p-type polysilicon, or p-type epitaxial single crystal silicon, while the word lines 1116, 1117 can be made using relatively heavily doped p+-type polysilicon.

Subsequently, a layer of silicide (e.g. tungsten silicide, cobalt silicide, titanium silicide) can be formed over the top surfaces of the word lines 1116, 1117.

As a result, a 3D array of memory cells configured in a NAND flash array can formed. The source, drain and channel are formed in the silicon semiconductor strips 711-714, the layer 1115 of the memory material includes a tunneling dielectric layer 1197 which can be formed of silicon oxide (O), a charge storage layer 1198 which can be formed of silicon nitride (N), a blocking dielectric layer 1199 which can be formed of silicon oxide (O), and the gate which can comprise polysilicon (S) of the word lines 1116, 1117.

Thus, memory cells comprising field effect transistors having charge storage structures are formed in the 3D array of cross-points. Using dimensions for the widths of the semiconductor strips and word lines on the order of 25 nanometers, with gaps between the ridge-shaped stacks on the order of 25 nanometers, a device having a few tens of layers (e.g. 32 layers) can approach terabit capacity ($10^{12}$) in a single chip.

The layer 1115 of memory material can comprise other charge storage structures. For example, a bandgap engineered SONOS (BE-SONOS) charge storage structure can be used which includes a dielectric tunneling layer 1197 that includes a composite of materials forming an inverted "U" shaped valence band under zero bias. In one embodiment, the composite tunneling dielectric layer includes a first layer referred to as a hole tunneling layer, a second layer referred to as a band offset layer, and a third layer referred to as an isolation layer. The hole tunneling layer of the layer 1115 in this embodiment comprises silicon dioxide on the side surface of the semiconductor strips formed for example using in-situ steam generation ISSG with optional nitridation by either a post deposition NO anneal or by addition of NO to the ambient during deposition. The thickness of the first layer of silicon dioxide is less than 20 Å, and preferably 15 Å or less. Representative embodiments can be 10 Å or 12 Å thick.

The band offset layer in this embodiment comprises silicon nitride lying on the hole tunneling layer, formed for example using low-pressure chemical vapor deposition LPCVD, using for example dichlorosilane DCS and $NH_3$ precursors at 680° C. In alternative processes, the band offset layer comprises silicon oxynitride, made using a similar process with an $N_2O$ precursor. The band offset layer thickness of silicon nitride is less than 30 Å, and preferably 25 Å or less.

The isolation layer in this embodiment comprises silicon dioxide, lying on the band offset layer of silicon nitride formed for example using LPCVD high temperature oxide HTO deposition. The thickness of the isolation layer of silicon dioxide is less than 35 Å, and preferably 25 Å or less. This three-layer tunneling layer results in an inverted U-shaped valence band energy level.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure establishes an inverted U-shaped valence band energy level in the three-layer tunneling dielectric layer, and enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

In a representative device, the layer 1115 of memory material includes a bandgap engineered composite tunneling dielectric layer comprising a layer of silicon dioxide less than 2 nm thick, a layer of silicon nitride less than 3 nm thick, and a layer of silicon dioxide less that 4 nm thick. In one embodiment, the composite tunneling dielectric layer consists of an ultrathin silicon oxide layer O1 (e.g. <=15 Å), an ultrathin silicon nitride layer N1 (e.g. <=30 Å) and an ultrathin silicon oxide layer O2 (e.g. <=35 Å), which results in an increase in the valence band energy level of about 2.6 eV at an offset 15 Å or less from the interface with the semiconductor body. The O2 layer separates the N1 layer from the charge trapping layer, at a second offset (e.g. about 30 Å to 45 Å from the interface), by a region of lower valence band energy level (higher hole tunneling barrier) and higher conduction band energy level. The electric field sufficient to induce hole tunneling raises the valence band energy level after the second location to a level that effectively eliminates the hole tunneling barrier, because the second location is at a greater distance from the interface. Therefore, the O2 layer does not significantly interfere with the electric field assisted hole tunneling, while improving the ability of the engineered tunneling dielectric to block leakage during low fields.

A charge trapping layer in the layer 1115 of memory material in this embodiment comprises silicon nitride having a thickness greater than 50 Å, including for example about 70 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

The blocking dielectric layer in the layer 1115 of memory material in this embodiment comprises a layer of silicon dioxide having a thickness greater than 50 Å, including for example about 90 Å in this embodiment, can be formed by wet conversion from the nitride by a wet furnace oxidation process. Other embodiments may be implemented using high temperature oxide (HTO) or LPCVD $SiO_2$. Other blocking dielectrics can include high-K materials like aluminum oxide.

In a representative embodiment, the hole tunneling layer can be 13 Å of silicon dioxide; the band offset layer can be 20 Å of silicon nitride; the isolation layer can be 25 Å of silicon dioxide; the charge trapping layer can be 70 Å of silicon nitride; and the blocking dielectric layer can be silicon oxide 90 Å thick. The gate material is p+ polysilicon (work function about 5.1 eV) used in the word lines 1116, 1117.

Figure 12:
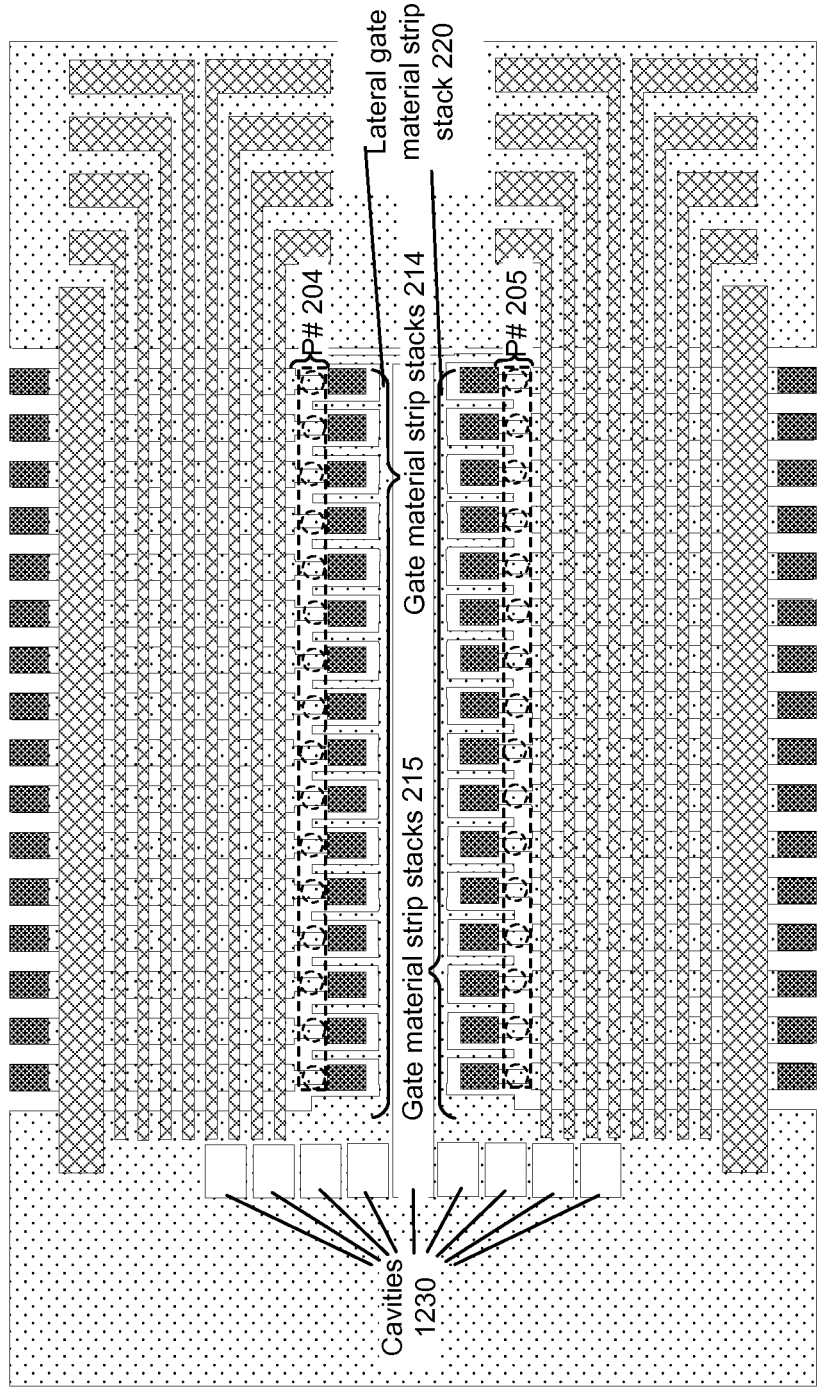

FIG. 12 is a top view, further showing additional stacks of semiconductor material strips.

Lateral gate material strip stack 220 has runs in a direction parallel to the word lines. In the top array, gate material strip stacks 214 extend in a perpendicular direction from the lateral gate material strip stack 220, past the bit line contacts but stopping short of the word lines. Lengths P#204 of the semiconductor material strip stacks 212 are formed. The width of lengths P#204 is narrower than the remainder of the semiconductor material strip stacks 212. In a subsequent step, dielectric fill such as oxide is formed in the gaps between semiconductor material strip stacks 212 and gate material strip stacks 214.

In the bottom array, gate material strip stacks 215 extend in a perpendicular direction from the lateral gate material strip stack 220, past the bit line contacts but stopping short of the word lines. Lengths P#205 of the semiconductor material strip stacks 213 are formed. The width of lengths P#205 is narrower than the remainder of the semiconductor material strip stacks 213. In a subsequent step, dielectric fill such as oxide is formed in the gaps between semiconductor material strip stacks 213 and gate material strip stacks 215.

Deep, high aspect ratio trenches can be formed in the stack, supporting many layers, using lithography based processes applying a carbon hard mask and reactive ion etching.

Cavities 1230 are formed to the side of the top array and the bottom array, and also in the middle of lateral gate material strip stack 220. As explained in connection with FIG. 3, the transistor gate of a single one of the transistors P1-P8 is formed from the gate material in the same plane of all stacks of gate material strip stacks 214, all stacks of gate material strip stacks 215, and the lateral gate material strip stack 220. By forming cavities 1230, the volume of gate material in any particular layer is reduced. In turn, the reduced volume of gate material leads to less RC delay and faster switching times for any of the transistors P1-P8.

Figure 13:
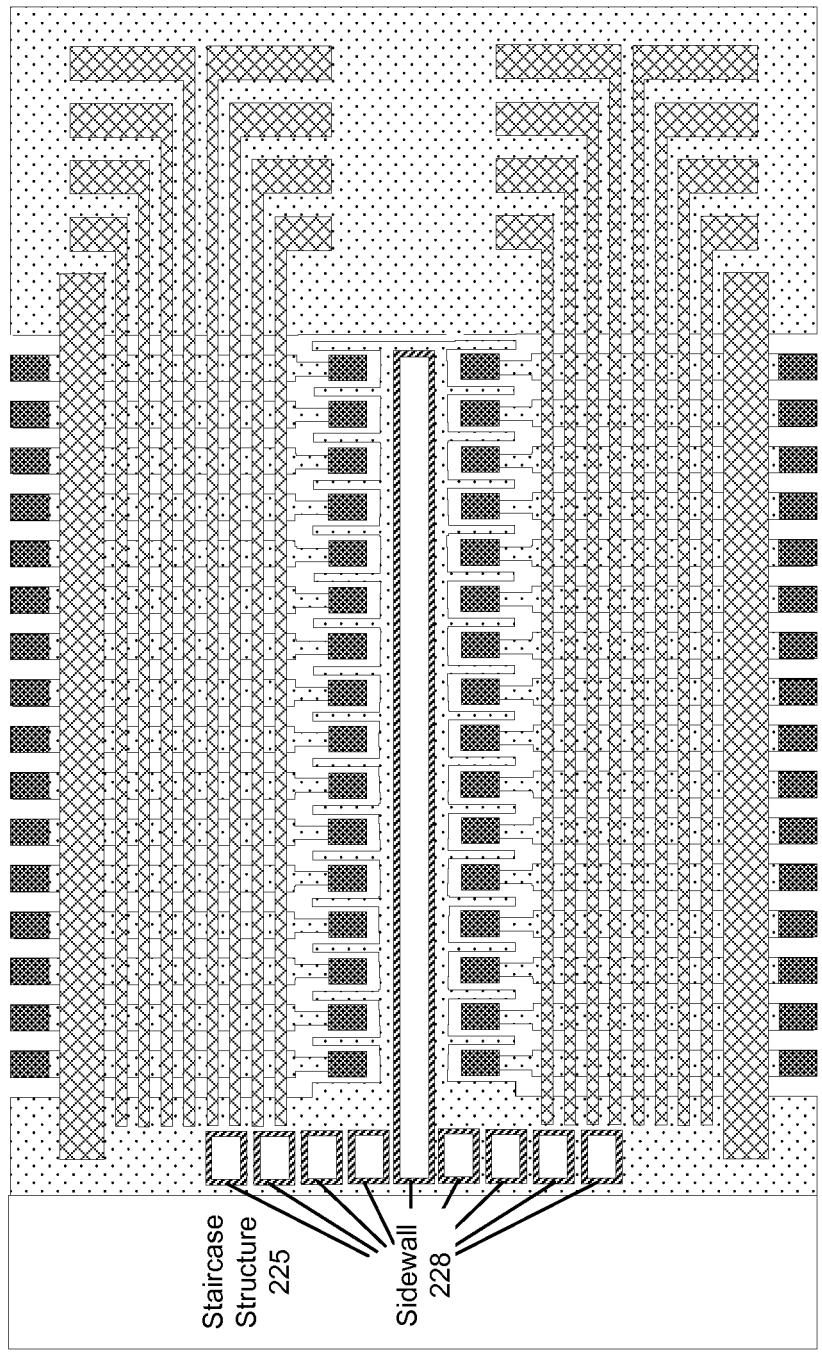

FIG. 13 is a top view, showing further processing of the 3D memory array. The staircase structure 225 is formed, which routes the string select signals that select a particular plane of the semiconductor material strip stacks 212 from control circuitry to the different planes of gate material strip stacks 214, gate material strip stacks 215, and the lateral gate material strip stack 220.

Sidewalls 228 are formed in the cavities 1230. Sidewall silicide formations can be CoSix (cobalt silicide), TiSix (titanium silicide), or other silicide compounds, made for example using SAlicide (self-aligned silicide) processes on sidewalls of sets of word lines. The silicide can be formed by depositing a thin silicide precursor, such as a transition metal layer over sidewalls. Then the structure is annealed, causing the silicide precursor to react with the conductive material to form low-resistance sidewall silicide formations. Remaining or excess transition metal is etched away.

Figure 14:
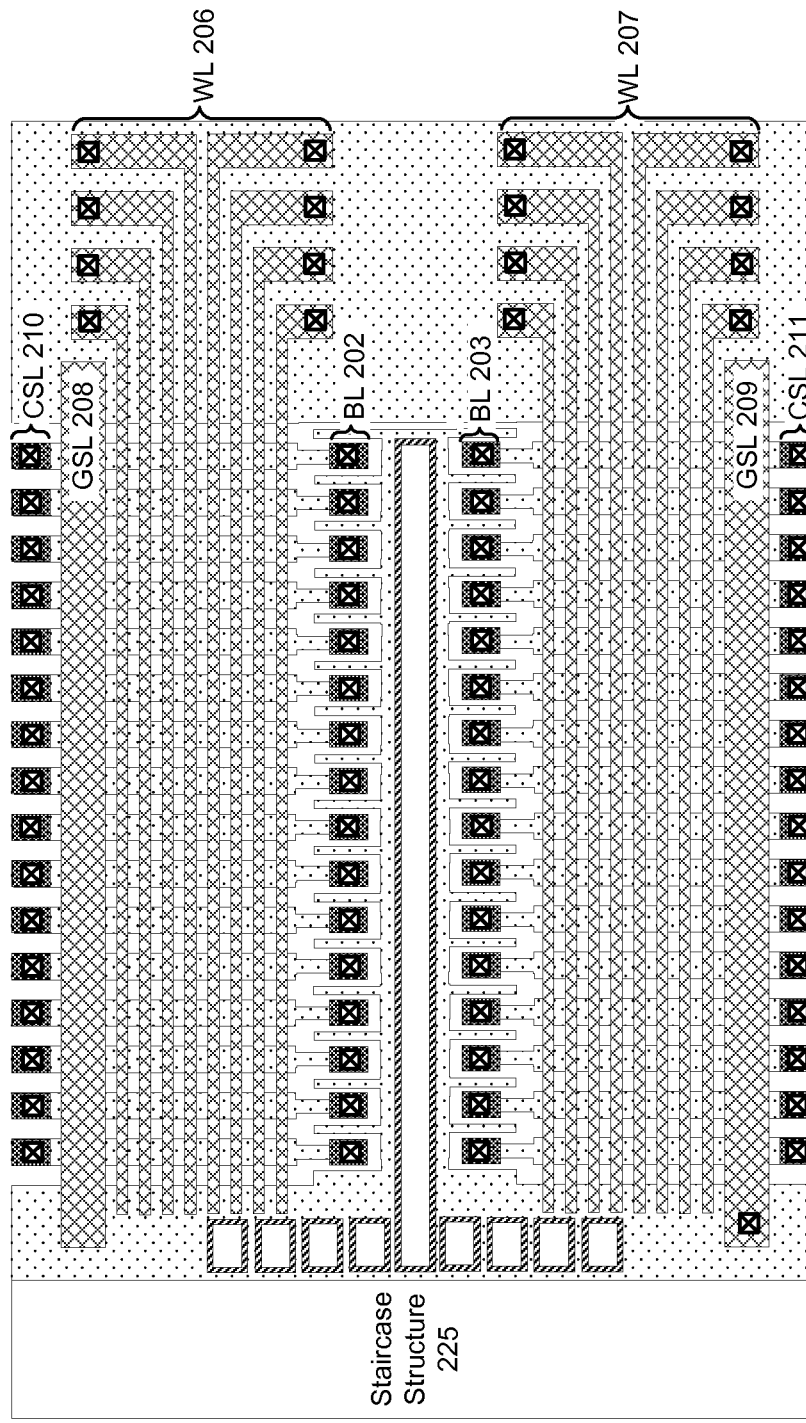

FIG. 14 is a top view, showing further processing of the 3D memory array. Contacts are formed on the plugs, including bit line 202, bit line 203, word lines 206, word lines 207, ground select line 208, ground select line 209, common source line contacts 210, and common source line contacts 211.

FIGS. 15-23 are steps in an example process flow to make the 3D memory structure in FIG. 4. FIGS. 15-23 generally correspond to FIGS. 6-14 in configuration, operation, and variations.

Figure 15:
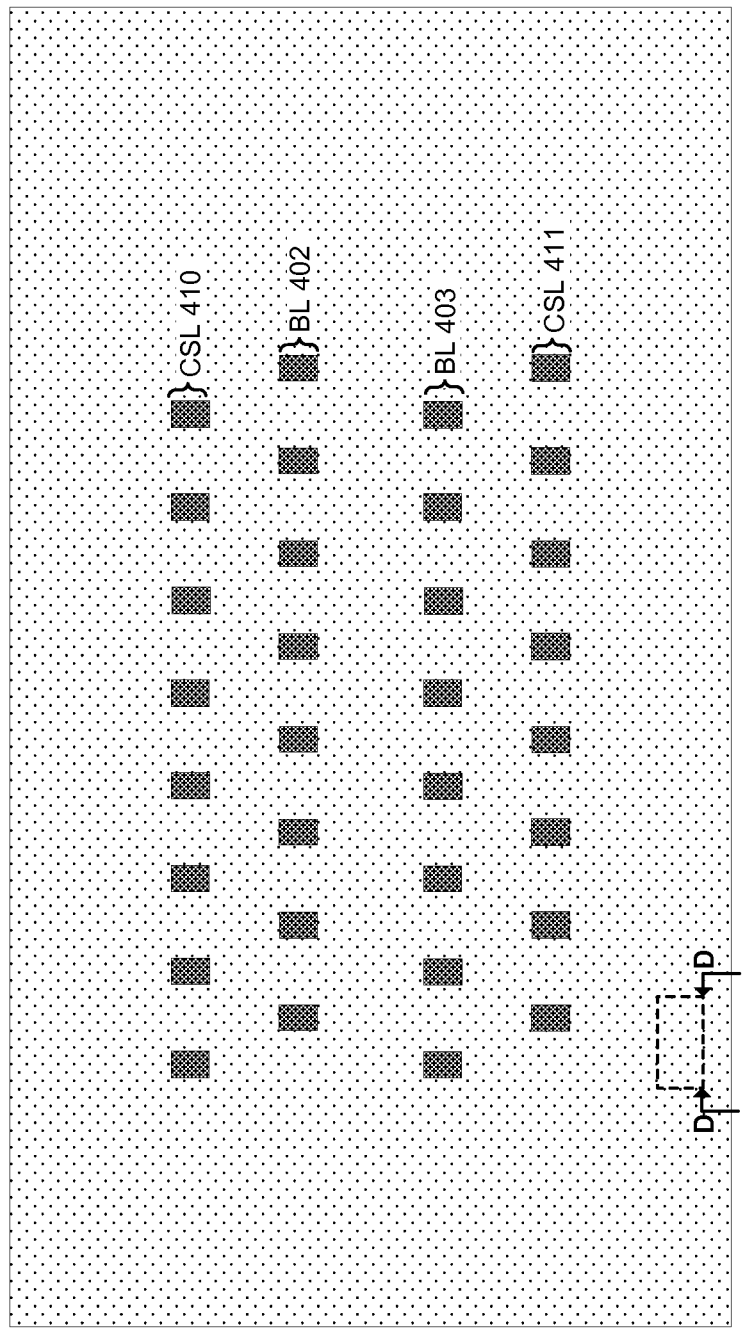
FIGS. 15-23 are steps in an example process flow to make the 3D memory structure in FIG. 4.

FIG. 15 is a top view of a stack of semiconductor material layers, and is generally similar to FIG. 6. Conductive plugs or other interlayer connectors are formed through the stack of semiconductor material layers. The conductive plugs subsequently become part of the bit line contacts 402, bit line contacts 403, common source line contacts 410, and common source line contacts 411.

Figure 16:
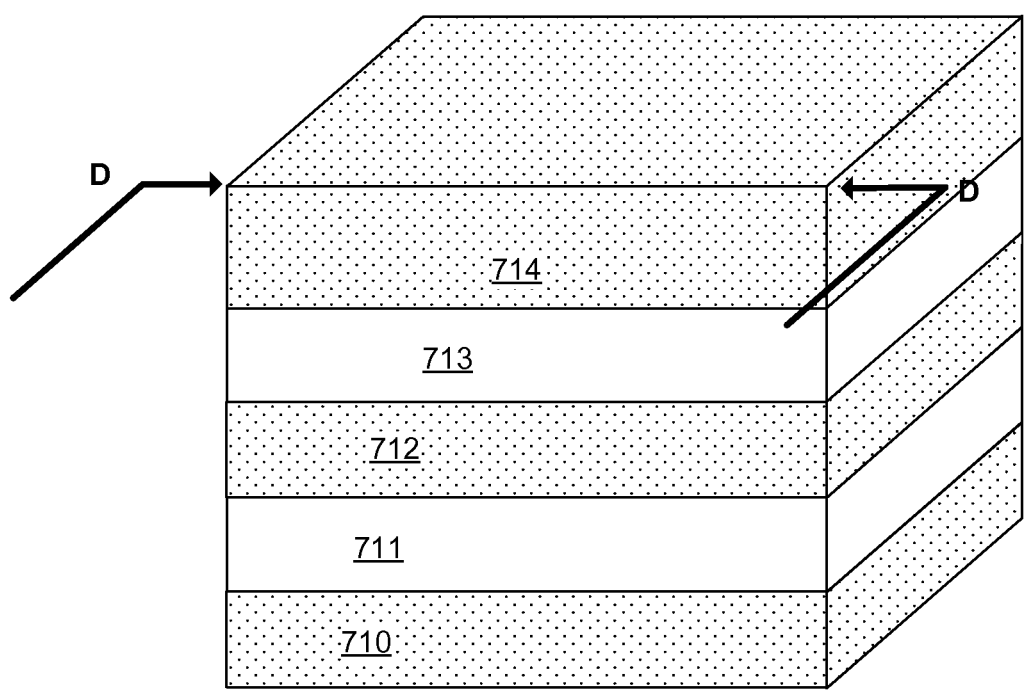

FIG. 15 includes a dashed rectangle with view line arrows D-D, which indicates the planar portion of FIG. 15 shown in the 3D perspective view of FIG. 16, and the viewing perspective of FIG. 15 taken in FIG. 16.

FIG. 16 is a 3D perspective view of a portion of FIG. 15, and is generally similar to FIG. 7. View line arrows D-D correspond to the view line arrows D-D in FIG. 15.

Figure 17:
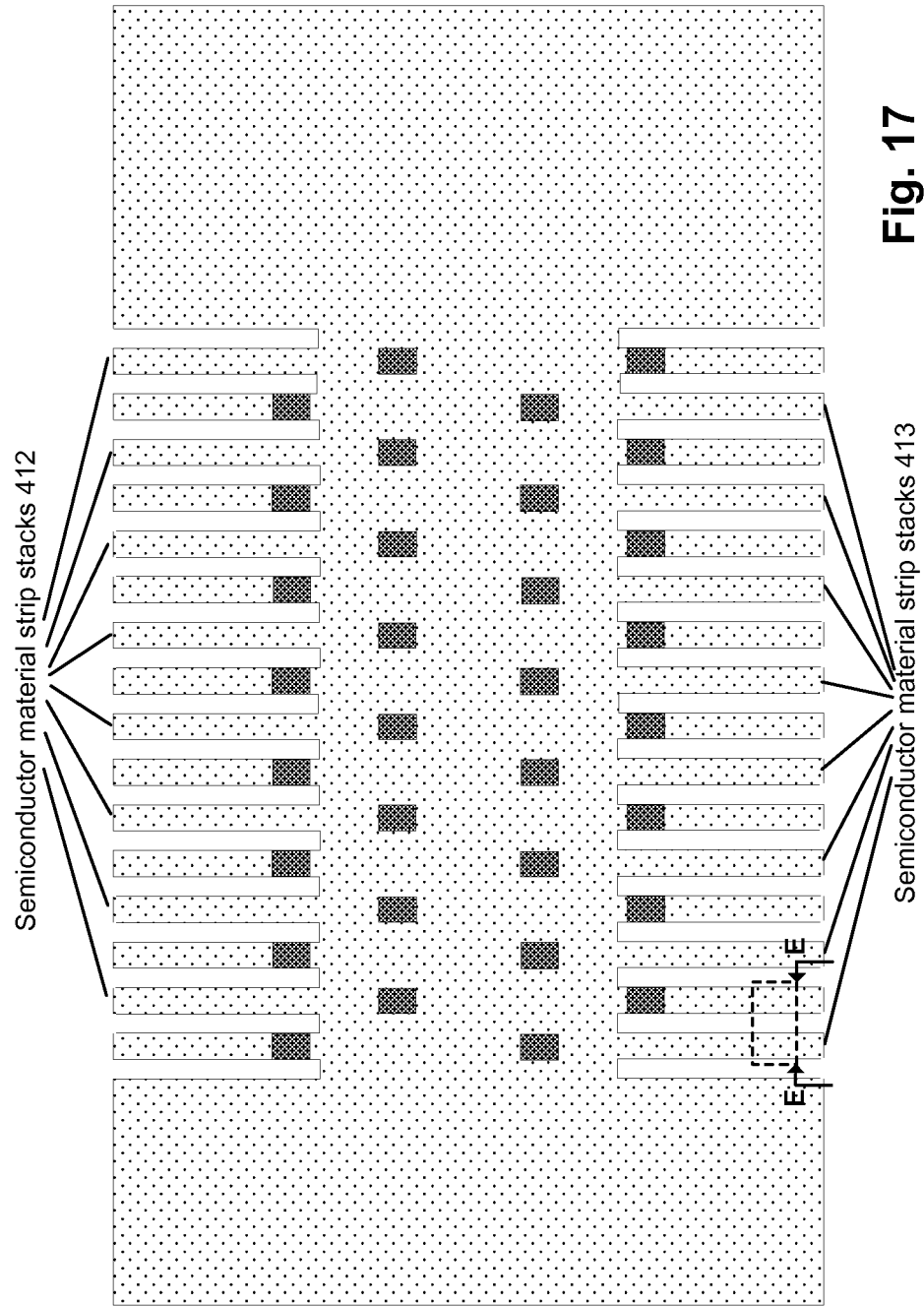

FIG. 17 is a top view of the stacks of semiconductor material strips, and is generally similar to FIG. 8. Semiconductor material strip stacks 412 and semiconductor material strip stacks 413 have opposite orientations. The semiconductor material strip stacks 412 and semiconductor material strip stacks 413 extend past the respective common source line plugs. In another embodiment, the semiconductor material strip stacks 412 and semiconductor material strip stacks 413 stop short of the respective common source line plugs.

Figure 18:
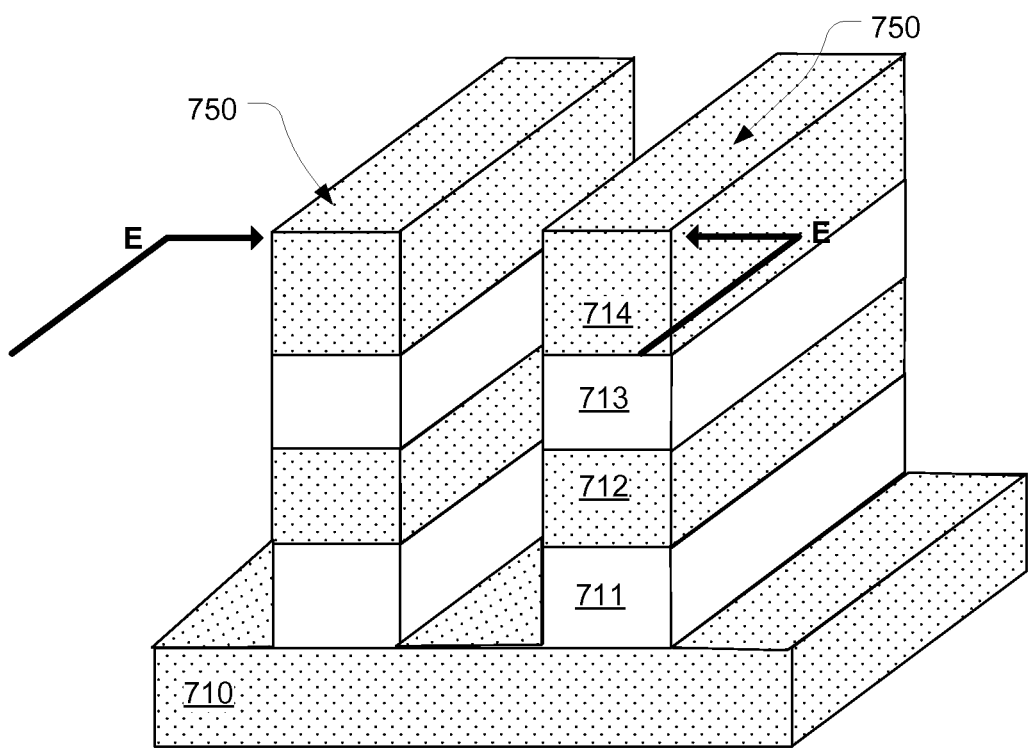

FIG. 17 includes a dashed rectangle with view line arrows E-E, which indicates the planar portion of FIG. 17 shown in the 3D perspective view of FIG. 18, and the viewing perspective of FIG. 17 taken in FIG. 18.

FIG. 18 is a 3D perspective view of a portion of FIG. 17, showing the result of a lithographic patterning step used to define a plurality of ridge-shaped stacks of conductive strips, and is generally similar to FIG. 9. View line arrows E-E correspond to the view line arrows E-E in FIG. 17.

Figure 19:
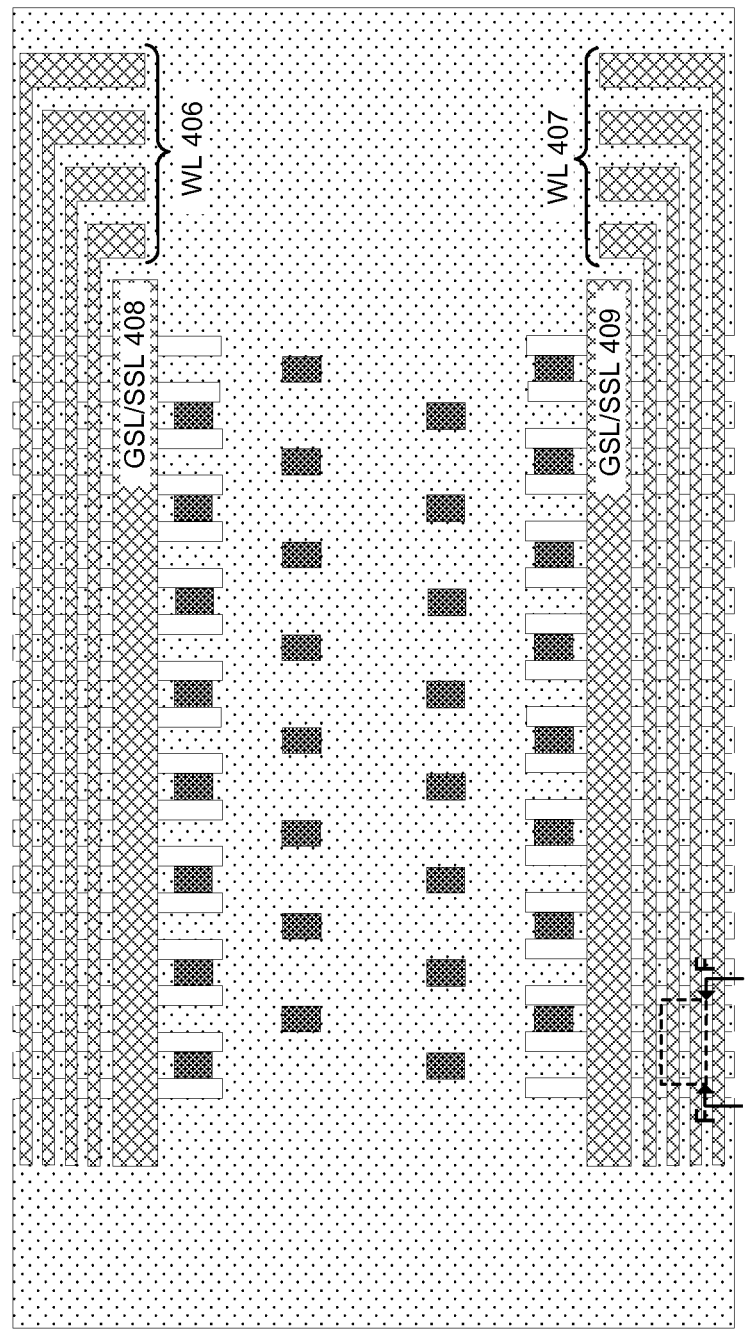

FIG. 19 is a top view of word lines over the stacks of semiconductor material strips, and is generally similar to FIG. 10. Word lines 406 cover a middle length of the semiconductor material strip stacks in the upper array. GSL/SSL 408 covers part of the semiconductor material strip stacks in between the word lines 406 and the common source line contacts. Word lines 407 cover a middle length of the semiconductor material strip stacks in the lower array. GSL/SSL 409 covers part of the semiconductor material strip stacks in between the word lines 407 and the common source line contacts.

Figure 20:
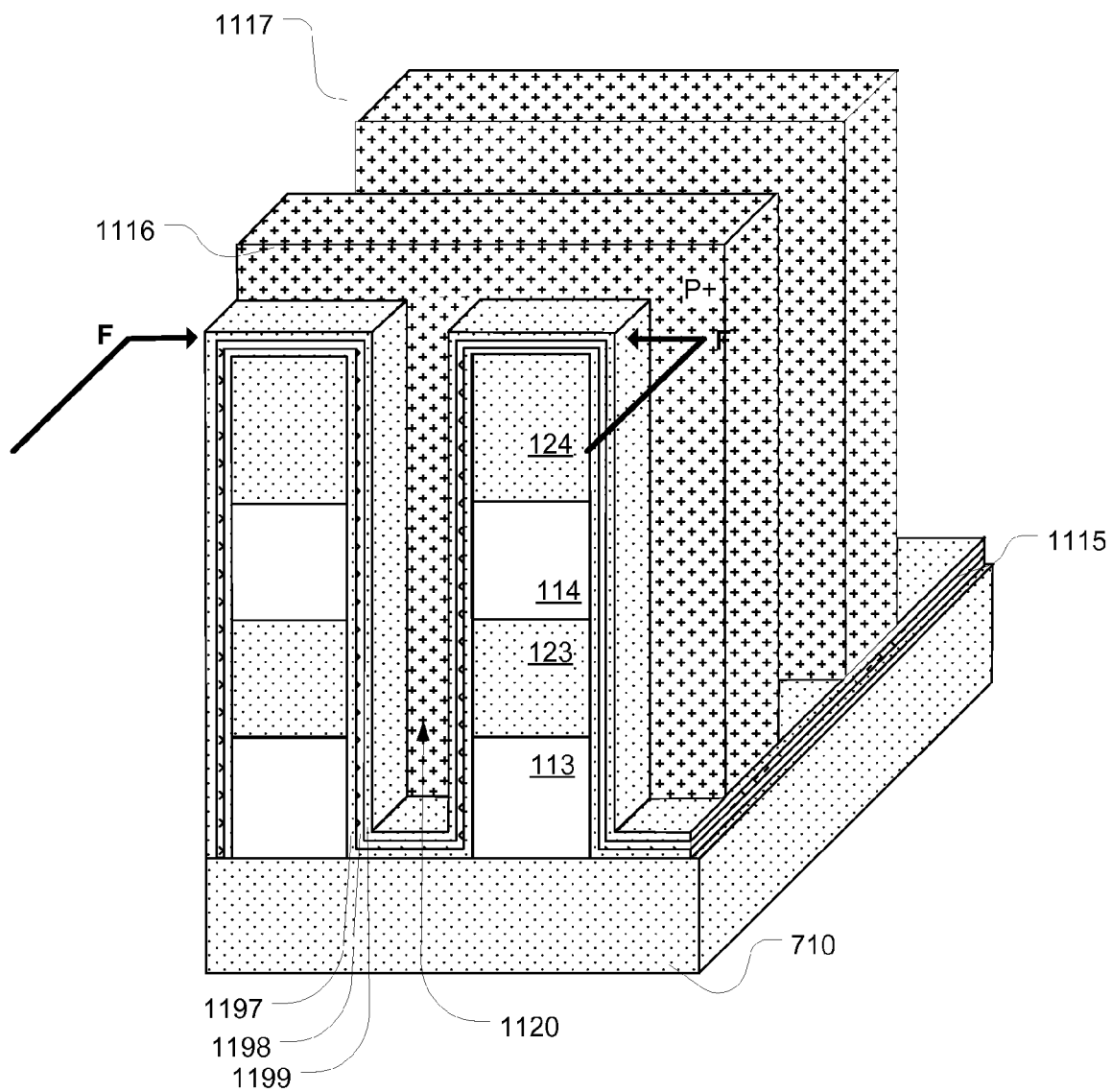

FIG. 19 includes a dashed rectangle with view line arrows F-F, which indicates the planar portion of FIG. 19 shown in the 3D perspective view of FIG. 20, and the viewing perspective of FIG. 20 taken in FIG. 19.

FIG. 20 is a 3D perspective view of a portion of FIG. 19, showing word lines over memory material and the stacks of semiconductor material strips, and is generally similar to FIG. 11.

Figure 21:
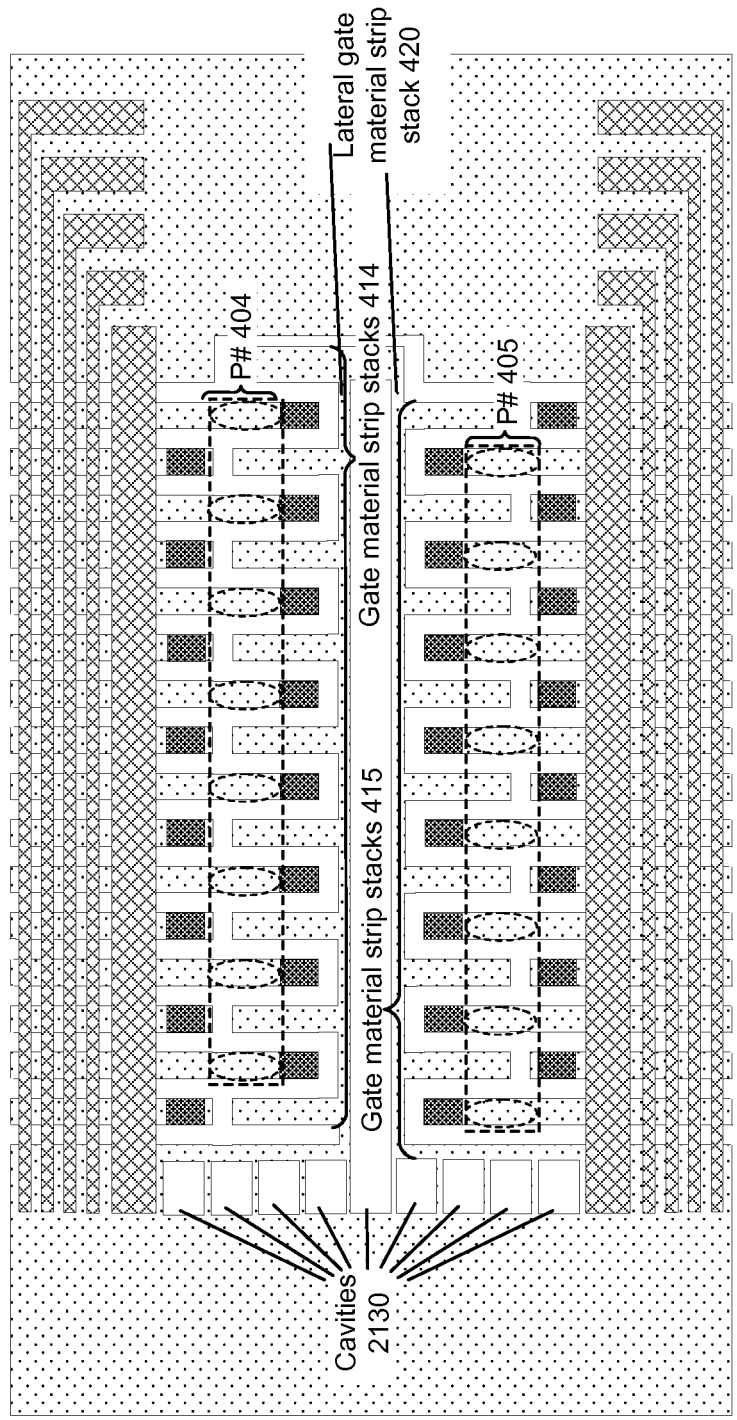

FIG. 21 is a top view, further showing additional stacks of semiconductor material strips, and is generally similar to FIG. 12.

Lateral gate material strip stack 420 has runs in a direction parallel to the word lines. In the top half-array, gate material strip stacks 414 extend in a perpendicular direction from the lateral gate material strip stack 420, past the bit line contacts but stopping short of the word lines (and GSL/SSL lines). Lengths P#404 of the semiconductor material strip stacks 412 are formed. The width of lengths P#404 is the same as the remainder of the semiconductor material strip stacks 412, though it can be wider or narrower in another embodiment. In a subsequent step, dielectric fill such as oxide is formed in the gaps between semiconductor material strip stacks 412 and gate material strip stacks 414.

In the bottom half-array, gate material strip stacks 415 extend in a perpendicular direction from the lateral gate material strip stack 420, past the bit line contacts but stopping short of the word lines (and GSL/SSL lines). Lengths P#405 of the semiconductor material strip stacks 413 are formed. The width of lengths P#405 is the same as the remainder of the semiconductor material strip stacks 413, though it can be wider or narrower in another embodiment. In a subsequent step, dielectric fill such as oxide is formed in the gaps between semiconductor material strip stacks 413 and gate material strip stacks 415.

Deep, high aspect ratio trenches can be formed in the stack, supporting many layers, using lithography based processes applying a carbon hard mask and reactive ion etching.

Cavities 2130 are formed to the side of the top half-array and the bottom half-array, and also in the middle of lateral gate material strip stack 420. As explained in connection with FIG. 5, the transistor gate of a single one of the transistors P1-P8 is formed from the gate material in the same plane of all stacks of gate material strip stacks 414, all stacks of gate material strip stacks 415, and the lateral gate material strip stack 420.

Figure 22:
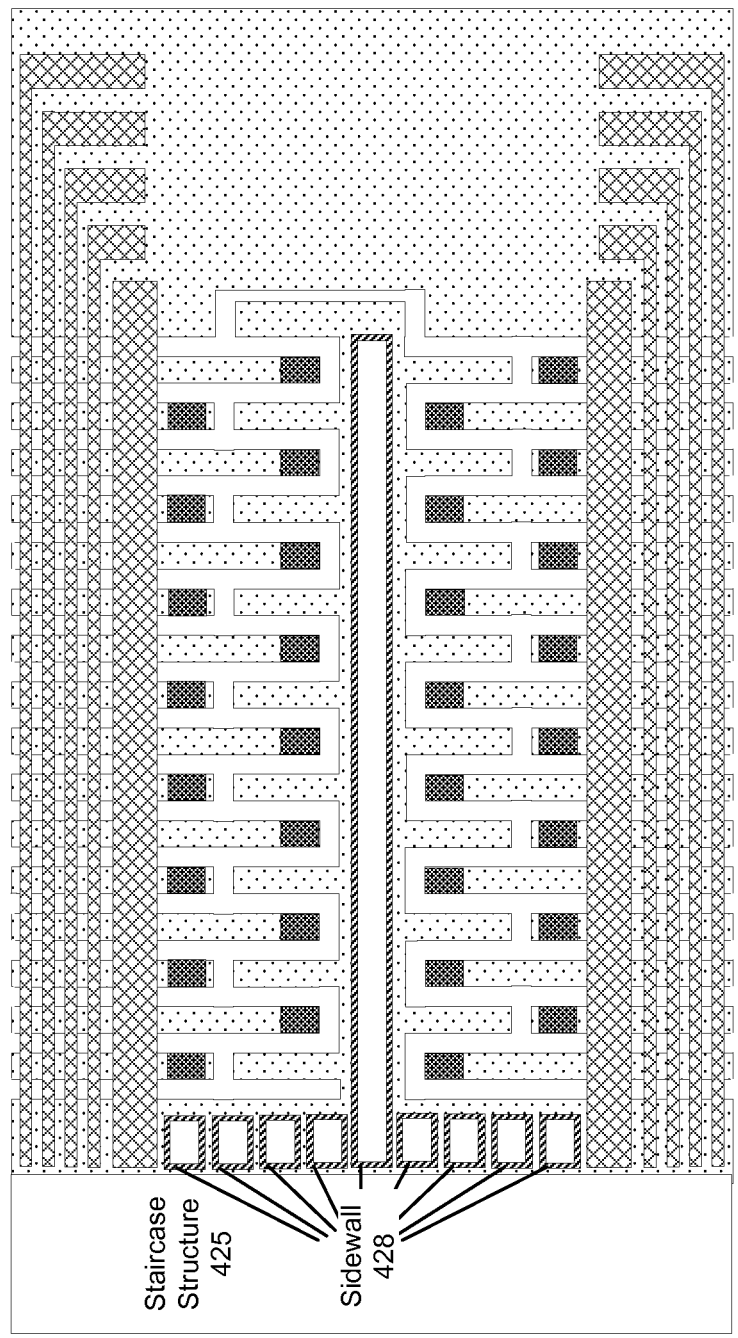

FIG. 22 is a top view, showing further processing of the 3D memory array, and is generally similar to FIG. 13. The staircase structure 425 is formed. Sidewalls 428 are formed in the cavities 1230.

Figure 23:
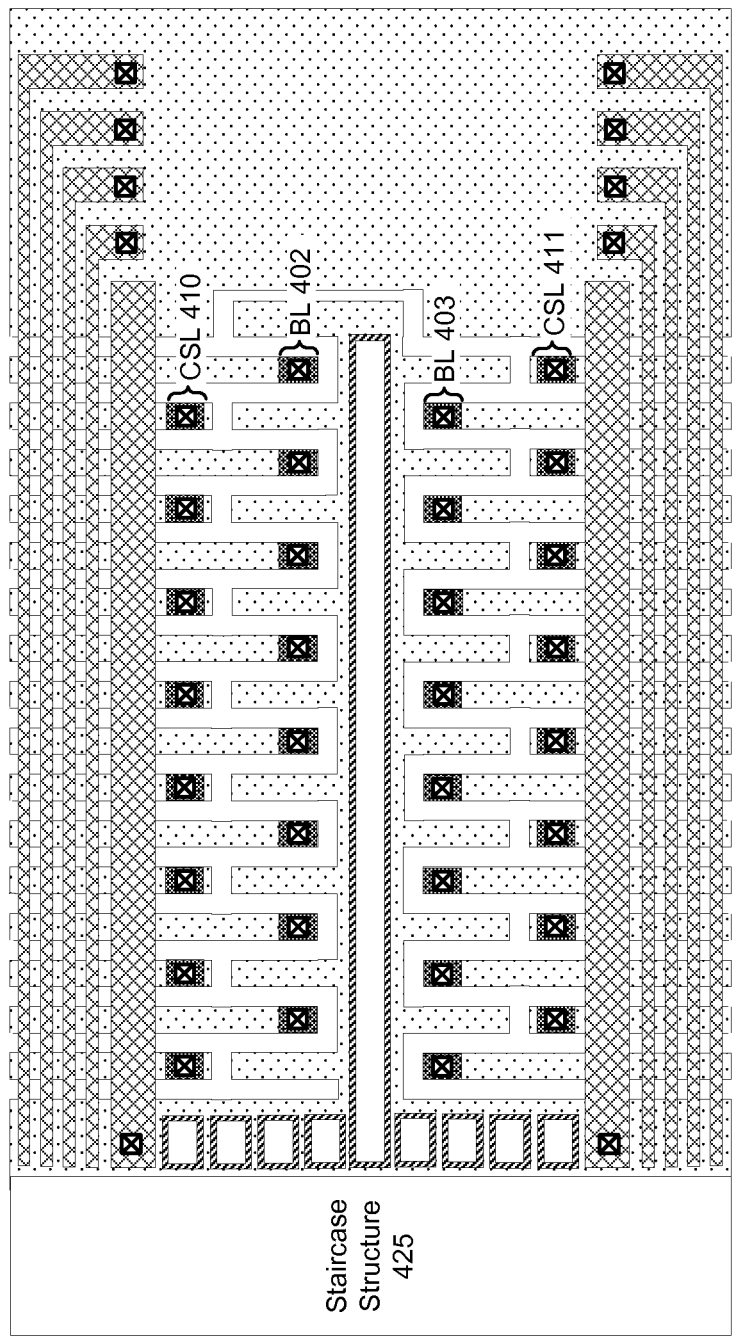

FIG. 23 is a top view, showing further processing of the 3D memory array, and is generally similar to FIG. 14. Contacts are formed on the plugs, including bit line 402, bit line 403, word lines 406, word lines 407, ground select line 408, ground select line 409, common source line contacts 410, and common source line contacts 411.

Figure 24:
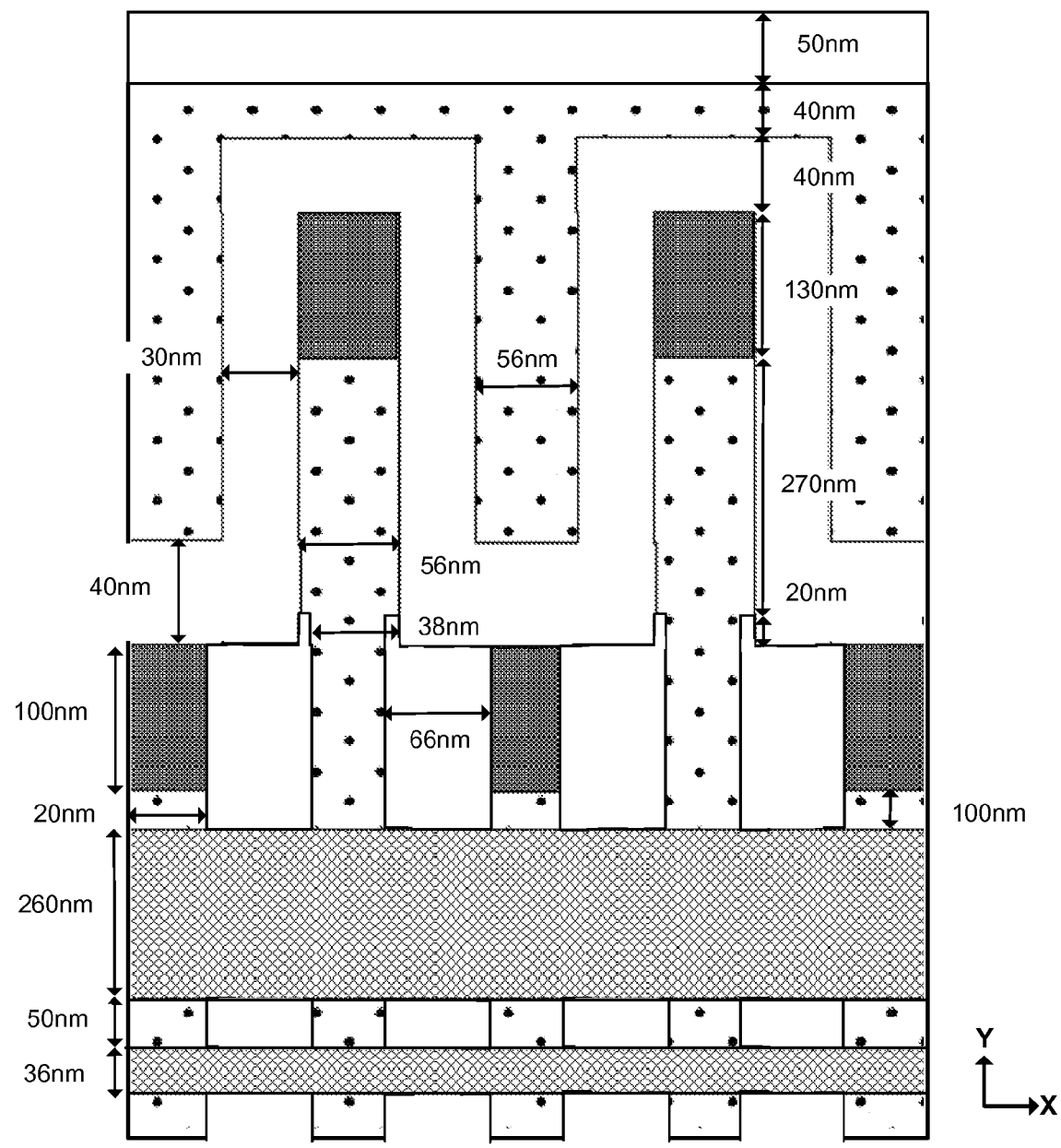
FIG. 24 is an example set of dimensions in an example of the 3D memory structure in FIG. 4.

FIG. 24 is an example set of dimensions in an example of the 3D memory structure in FIG. 4. A critical dimension in the X-axis direction is the 20 nm distance from where the semiconductor material strips narrow from 56 nm to 20 nm. A critical dimension in the Y-axis direction is the 38 nm distance including a 20 nm width of the semiconductor material strip and a 18 nm distance from the semiconductor material strip to the oxide. The array efficiency is improved to 74.2% from 69.2%.

Area efficiency is equal to: (area of array cells)/(area of array cells+area of overhead), where overhead includes the string select lines, ground select lines, the contact landing area, and other areas not occupied by the array cells.

In FIG. 24, oxide fills the white areas—both the serpentine white area above by the contacts having 130 nm length in the Y-direction, and the white area below by the contacts having 100 nm length in the Y-direction. The white areas were etched in different steps.

Figure 25:
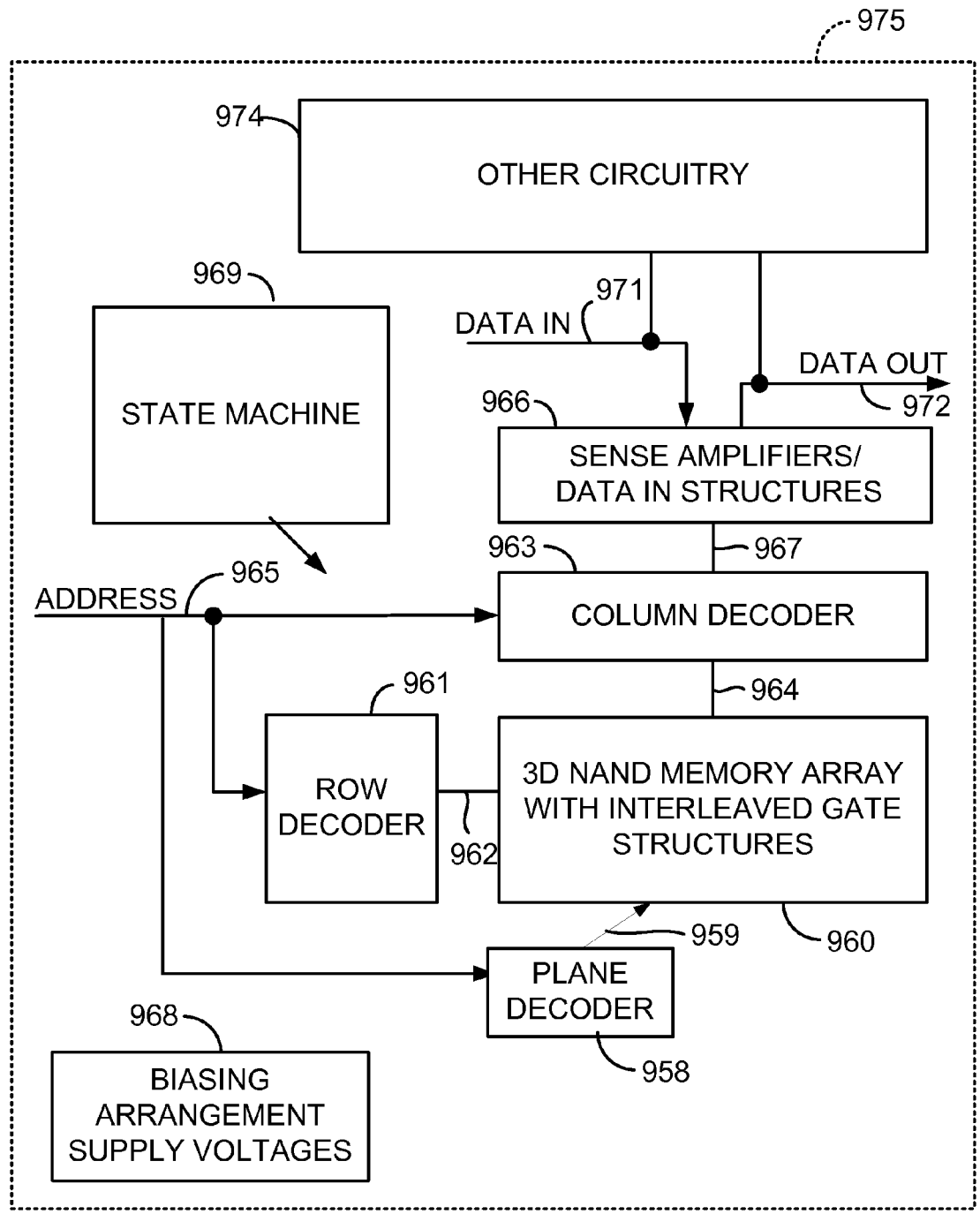
FIG. 25 is a schematic diagram of an integrated circuit including a 3D NAND memory array with interleaved stacks of strips, and row, column and plane decoding circuitry.

FIG. 25 is a simplified block diagram of an integrated circuit according to an embodiment of the present invention. The integrated circuit line 975 includes a 3D NAND flash memory array 960, implemented as described herein, on a semiconductor substrate with interleaved control structures. A short set of gate material stacks applies a field effect to turn on and off part of a long set of semiconductor material stacks. A row decoder 961 is coupled to a plurality of word lines 962, and arranged along rows in the memory array 960. A column decoder 963 is coupled to a plurality of bit lines 964 arranged along columns corresponding to stacks in the memory array 960 for reading and programming data from the memory cells in the array 960. A plane decoder 958 is coupled to a plurality of planes in the memory array 960 via string select lines 959. Addresses are supplied on bus 965 to column decoder 963, row decoder 961 and plane decoder 958. Sense amplifiers and data-in structures in block 966 are coupled to the column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the NAND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller sends signals to the plane decoder 958 which send a set of voltages to the string select lines 959 and in turn to the short set of gate material stacks to acts as gates for part of a long set of semiconductor material stacks, such as by applying a field effect to turn on and off the part of the long set of semiconductor material stacks.

For any single semiconductor material strip in any single stack of the semiconductor material strip stacks, a pair of gate material strips in gate material strip stacks are coplanar with, and run parallel along both sides of the single semiconductor material strip. The pair of gate material strips are configured as a gate for part of the semiconductor material strip, and the controller applies a bias arrangement to the pair of gate material strips to act as the gate for part of the semiconductor material strip. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
    a first plurality of stacks of semiconductor material strips;
    a first plurality of word lines arranged orthogonally over, and having surfaces conformal with, the first plurality of stacks, such that a 3D array of memory elements is established at cross-points between surfaces of the first plurality of stacks and the plurality of word lines; and
    a second plurality of stacks of gate material strips interleaved with, and coplanar with, the first plurality of stacks, the second plurality of stacks configured as gates for the first plurality of stacks.

2. The device of claim 1, further comprising:
    control circuitry applying a plurality of bias arrangements to control the second plurality of stacks as gates for the first plurality of stacks.

3. The device of claim 1,
    wherein the first plurality of stacks of semiconductor material strips includes:
        a first length along which the plurality of word lines are arranged orthogonally over, and
        a second length adjacent to the first length, along which no word lines are arranged orthogonally over; and
    wherein the second plurality of stacks is interleaved with the first plurality of stacks along at least part of the second length but not along the first length.

4. The device of claim 1, further comprising:
    a lateral stack of gate material strips, the lateral stack being perpendicular to the second plurality of stacks, the second plurality of stacks extending from the lateral stack of gate material strips.

5. The device of claim 4,
    wherein a plurality of planes of gate material strips separated by insulating material are in: (i) stacks in the second plurality of stacks of gate material strips, and (ii) the lateral stack of gate material strips, and
    gate material strips in different stacks of the second plurality of stacks and at a same plane of the plurality of planes, are electrically interconnected to each other by a gate material strip in the lateral stack at the same plane.

6. The device of claim 4,
    wherein the lateral stack of gate material strips has an outer portion proximate to the second plurality of stacks, and an inner portion separated from the second plurality of stacks by the outer portion, the outer portion including a plurality of planes of gate material strips separated by insulating material, and an inner portion filled with insulating material.

7. The device of claim 4, further comprising:
    a third plurality of stacks of semiconductor material strips;
    a second plurality of word lines arranged orthogonally over, and having surfaces conformal with, the third plurality of stacks, such that another 3D array of memory elements is established at cross-points between surfaces of the third plurality of stacks and the second plurality of word lines;
    a fourth plurality of stacks of gate material strips interleaved with the third plurality of stacks, the fourth plurality of stacks configured as gates for the fourth plurality of stacks by at least dielectric,
    wherein the lateral stack has first and second sides on opposite sides of the lateral stack, wherein the first side of the lateral stack faces the first plurality of stacks, the second plurality of stacks, the first plurality of word lines, wherein the second plurality of stacks extends from the first side of the lateral stack of gate material strips, wherein the second side of the lateral stack faces the third plurality of stacks, the fourth plurality of stacks, the second plurality of word lines, wherein the fourth plurality of stacks extends from the second side of the lateral stack of gate material strips.

8. The device of claim 7, wherein stacks in the second plurality of stacks are at a first plurality of positions along a length of the lateral stack, and stacks in the fourth plurality of stacks are at the first plurality of positions along the length of the lateral stack.

9. The device of claim 7, wherein stacks in the second plurality of stacks are at a first plurality of positions along a length of the lateral stack, stacks in the fourth plurality of stacks are at a second plurality of positions along the length of the lateral stack, and the first plurality of positions is staggered relative to the second plurality of positions.

10. The device of claim 1, wherein a plurality of planes of gate material strips separated by insulating material are in: (i) stacks in the second plurality of stacks of gate material strips, and (ii) the lateral stack of gate material strips, and further comprising:

control circuitry that selects memory cells at a particular plane of the plurality of planes in the first plurality of stacks, by applying a first one of the plurality of bias arrangements to the particular plane in the second plurality of stacks, and a second one of the plurality of bias arrangements to other planes in the second plurality of stacks.

11. The device of claim 1, wherein the second plurality of stacks is interleaved with the first plurality of stacks, such that one stack of the second plurality of stacks is in between two adjacent stacks of the first plurality of stacks.

12. The device of claim 1, wherein adjacent stacks in the first plurality of stacks have opposite stack orientations including a first stack orientation of bit line contact-to-source line contact and a second stack orientation of source line contact-to-bit line contact.

13. The device of claim 12, wherein the second plurality of stacks is interleaved with the first plurality of stacks, such that one stack of the second plurality of stacks is in between two adjacent stacks of the first plurality of stacks having a same stack orientation out of the first stack orientation and the second stack orientation.

14. The device of claim 1, wherein adjacent stacks in the first plurality of stacks have a same stack orientations including one of a first stack orientation of bit line contact-to-source line contact and a second stack orientation of source line contact-to-bit line contact.

15. The device of claim 1, wherein stacks in the first plurality of stacks of semiconductor material strips have first ends coupled to a source line voltage and second ends coupled to a bit line voltage.

* * * * *